(12) United States Patent
Nakata

(10) Patent No.: US 10,581,386 B2
(45) Date of Patent: Mar. 3, 2020

(54) PROTECTIVE DEVICE

(71) Applicant: Panasonic Intellectual Property Management Co., Ltd., Osaka (JP)

(72) Inventor: Yasuo Nakata, Kanagawa (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 16/061,727

(22) PCT Filed: Dec. 16, 2016

(86) PCT No.: PCT/JP2016/005157
§ 371 (c)(1),
(2) Date: Jun. 13, 2018

(87) PCT Pub. No.: WO2017/110073
PCT Pub. Date: Jun. 29, 2017

(65) Prior Publication Data
US 2018/0358937 A1 Dec. 13, 2018

(30) Foreign Application Priority Data

Dec. 25, 2015 (JP) .................................. 2015-254863

(51) Int. Cl.
*H03F 1/52* (2006.01)
*H04R 3/00* (2006.01)
(Continued)

(52) U.S. Cl.
CPC .............. *H03F 1/52* (2013.01); *H03F 3/187* (2013.01); *H03F 3/20* (2013.01); *H03F 3/45* (2013.01);
(Continued)

(58) Field of Classification Search
CPC .................................. H03F 1/52; H03F 1/523
(Continued)

(56) References Cited

U.S. PATENT DOCUMENTS 5,847,610 A * 12/1998 Fujita ........................ H03F 1/52
330/298
7,092,533 B1 8/2006 Hasegawa et al.
(Continued)

FOREIGN PATENT DOCUMENTS

JP 2000-174571 6/2000
JP 2007-295496 A 11/2007
(Continued)

OTHER PUBLICATIONS

The Extended European Search Report dated Nov. 19, 2018 for the related European Patent Application No. 16877978.3.
(Continued)

*Primary Examiner* — Steven J Mottola
(74) *Attorney, Agent, or Firm* — Greenblum & Bernstein, P.L.C.

(57) ABSTRACT

A protective device that detects an abnormal current in a driving circuit for driving a speaker includes a sound level detector, a current level detector, and a determination section. The sound level detector detects a sound level of an audio signal output to the driving circuit. The current level detector detects a current level of a current flowing in the driving circuit from a power source. The determination section generates, based on a detection signal of the sound level and a detection signal of the current level, a protection command signal when the current level larger than a second threshold is detected when the sound level of the audio signal is smaller than a first threshold.

20 Claims, 17 Drawing Sheets

(51) Int. Cl.
  *H03F 3/187*   (2006.01)
  *H03F 3/20*    (2006.01)
  *H03F 3/45*    (2006.01)
(52) U.S. Cl.
  CPC .............. *H04R 3/00* (2013.01); *H04R 3/007* (2013.01); *H03F 2200/03* (2013.01); *H03F 2200/462* (2013.01); *H03F 2200/471* (2013.01)
(58) Field of Classification Search
  USPC .............................................. 330/207 P, 298
  See application file for complete search history.

(56) References Cited

U.S. PATENT DOCUMENTS

| | | |
|---|---|---|
| 2005/0231287 A1 | 10/2005 | Wong et al. |
| 2006/0103467 A1 | 5/2006 | Schoenberger |

FOREIGN PATENT DOCUMENTS

| | | |
|---|---|---|
| JP | 2008-521289 A | 6/2008 |
| JP | 2011-130240 A | 6/2011 |
| JP | 2012-015953 A | 1/2012 |
| JP | 2015-162732 A | 9/2015 |

OTHER PUBLICATIONS

International Search Report of PCT application No. PCT/JP2016/005157 dated Feb. 28, 2017.
Notice of Reasons for Refusal in Japan dated Sep. 17, 2019 for related Japanese Patent Application No. 2016-247830 and English translation thereof.

\* cited by examiner

PROTECTIVE DEVICE

This application is a U.S. national stage application of the PCT International Application No. PCT/JP2016/005157 filed on Dec. 16,2016, which claims the benefit of foreign priority of Japanese patent application No. 2015-254863 filed on Dec. 25, 2015, the contents all of which are incorporated herein by reference.

TECHNICAL FIELD

The present invention relates to a protective device.

BACKGROUND ART

At an output stage of an audio apparatus, a power amplifier IC (power amplifier) is generally provided, which makes driving current that is a power-amplified audio signal flow in a speaker. Then, at the output sage of the audio apparatus, an overcurrent detection device or a DC offset detection device is provided in some cases to protect the power amplifier IC (power amplifier) and the speaker from abnormal current due to overcurrent or DC offset (hereinafter, collectively referred to as "abnormal current"). Such abnormal current is relatively large current when caused by short circuit or earth fault, so that it can be easily detected by the overcurrent detection device.

FIG. 18 is a diagram illustrating a relationship between a threshold current for determining overcurrent and driving current by an audio signal in a typical overcurrent detection device. In FIG. 18, current waveform (I1) indicates driving current in normal time, and current waveform (I2) indicates driving current in a case where abnormal current is generated. Driving current (I1) is a current dependent on whether the audio signal is large or small, so a large driving current flows in a large volume period, and a small driving current flows in a small volume period. Then, in the typical overcurrent detection device, threshold current Ith for determining generation of an abnormal current is set using the driving current that flows in the large volume period as a reference. In this case, in the large volume period, a feeble abnormal current is buried in the driving current that is a large current, and an error readily occurs in the flowing driving current due to variation in manufacture of an impedance, a current amplification factor, or the like of a speaker or a power amplifier. Consequently, in a typical overcurrent detection device, detection of the feeble abnormal current is difficult, and threshold current Ith for determining generation of the abnormal current is set so as to be considerably large with respect to the driving current flowing in the large volume period.

In an audio apparatus, there is a case where an impedance of a speaker or a power amplifier, a property of a transistor, or the like is changed due to accumulation of dust or time degradation, and in this case, different from the short circuit current or the earth fault current, feeble abnormal current (I2) continues to flow. Such feeble abnormal current cannot be detected by the above-mentioned overcurrent detection device, so the continuous flow results in heat generation due to resistive loss, causing a problem that a speaker or a power amplifier is damaged.

Against such a background, for example, Patent Literature 1 describes protecting a power amplifier by detecting a DC offset in a constant mute period after a power source is turned on.

CITATION LIST

Patent Literature

PTL 1: Unexamined Japanese Patent Publication No. 2000-174571

SUMMARY OF THE INVENTION

The present invention provides a protective device capable of detecting an abnormal current in a driving circuit for driving a speaker also when sound is regenerated.

An aspect of the present invention is a protective device that detects an abnormal current in a driving circuit for driving a speaker. The protective device includes a sound level detector, a current level detector, and a determination section. The sound level detector detects a sound level of an audio signal output to the driving circuit. The current level detector detects a current level of a current flowing in the driving circuit from a power source. The determination section generates, based on a detection signal of the sound level and a detection signal of the current level, a protection command signal when the current level larger than a second threshold is detected when the sound level of the audio signal is smaller than a first threshold.

Note that optional combinations of the above-mentioned constituent elements, and modifications of aspects of the present invention modified between method, apparatus, system, recording medium (including computer-readable non-transient recording medium), computer program, or the like are also available as aspects of the present invention.

The present invention makes it possible to detect a feeble abnormal current also when sound is regenerated, making it possible to prevent breakage of a speaker or a power amplifier.

DESCRIPTION OF EMBODIMENTS

Before describing exemplary embodiments of the present invention, a problem in a conventional technique will be simply described. The above-mentioned Patent Literature 1 has a configuration that detects a DC offset of a power amplifier only when sound is not regenerated, for example, a time shortly after turning on a power source, so that no abnormal current can be detected when sound is regenerated. Also, in above-mentioned Patent Literature 1, an abnormal current that appears only when sound is regenerated cannot be detected.

On the other hand, as a using mode of an audio apparatus, sound is often continuously regenerated like a case in which a long musical work is sequentially regenerated, so that in the method that detects an abnormal current only when sound is not generated like above-described Patent Literature 1, a voice coil or a power amplifier of a speaker can be disadvantageously damaged by the abnormal current that continuously flows.

(First Exemplary Embodiment)

Hereinafter, a configuration of a protective device according to the exemplary embodiment will be described with reference to FIG. 1 to FIG. 4. The protective device according to the exemplary embodiment is used in an audio apparatus and detects an abnormal current in a driving circuit for driving speaker 4. Note that the abnormal current denotes a current superimposed on a driving current depending on an audio signal such as an overcurrent due to short circuit or earth fault, or a current due to a DC offset.

Figure 1:
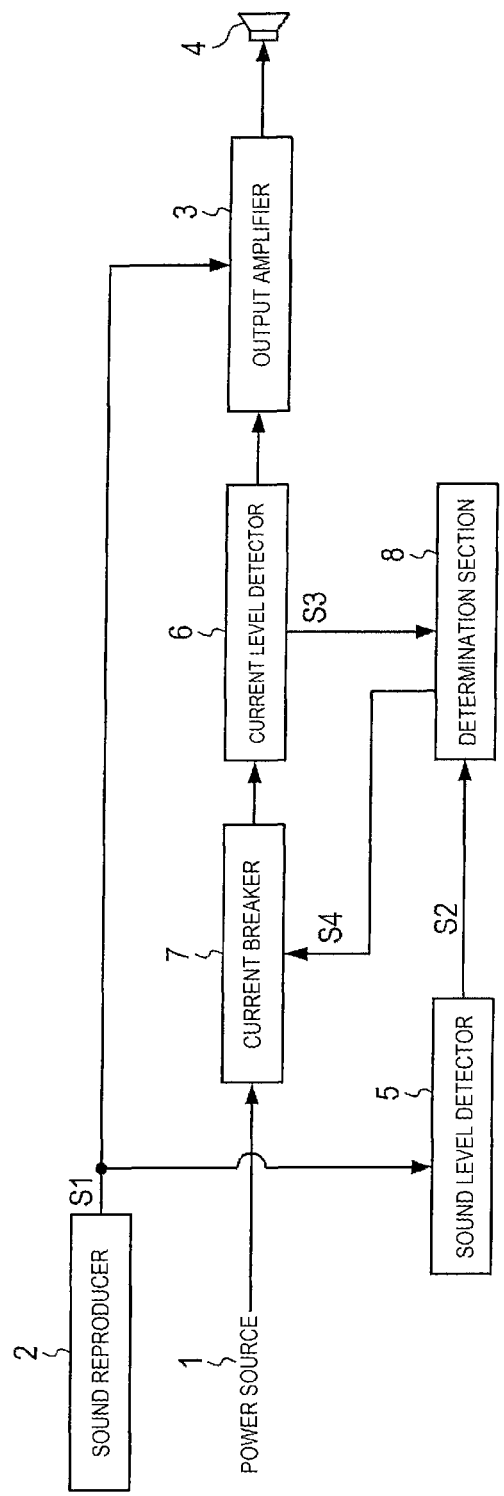
FIG. 1 is a diagram illustrating an example of a configuration of a protective device according to a first exemplary embodiment.
Figure 2:
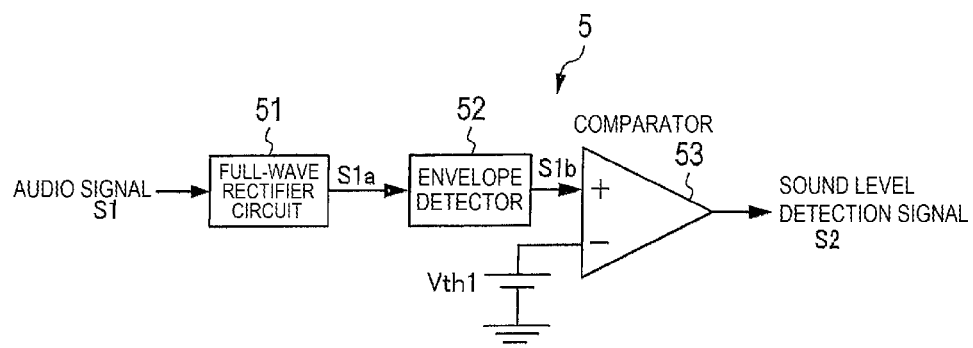
FIG. 2 is a diagram illustrating an example of a configuration of a sound level detector according to the first exemplary embodiment.
Figure 3:
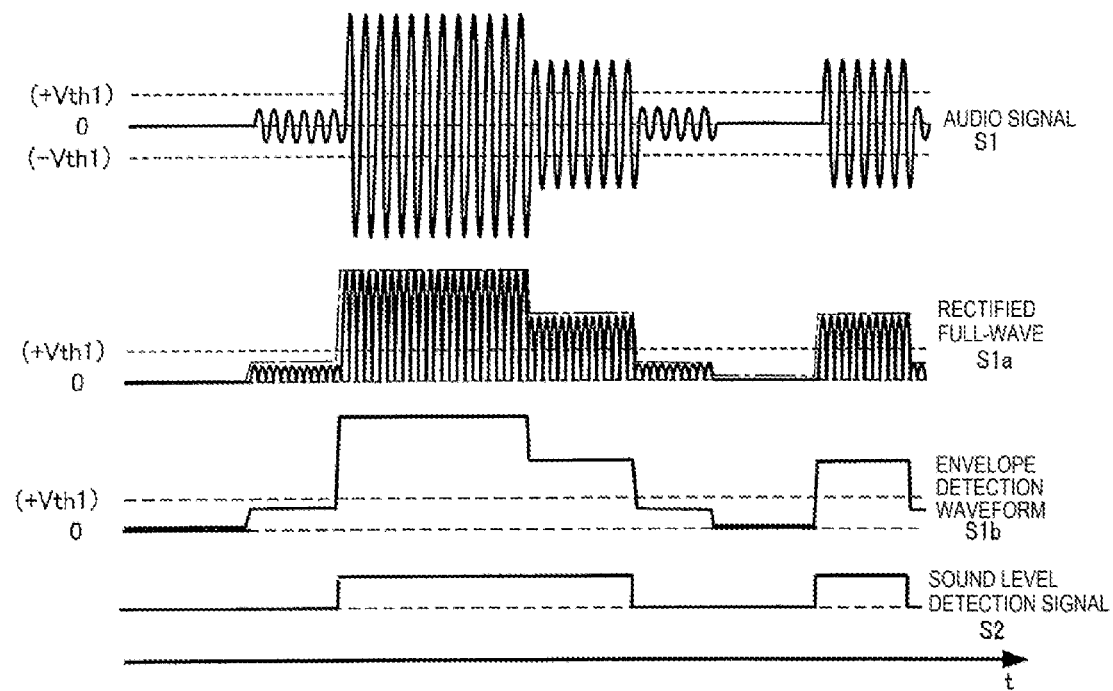
FIG. 3 is a diagram illustrating an example of an operation of the sound level detector according to the first exemplary embodiment.
Figure 4:
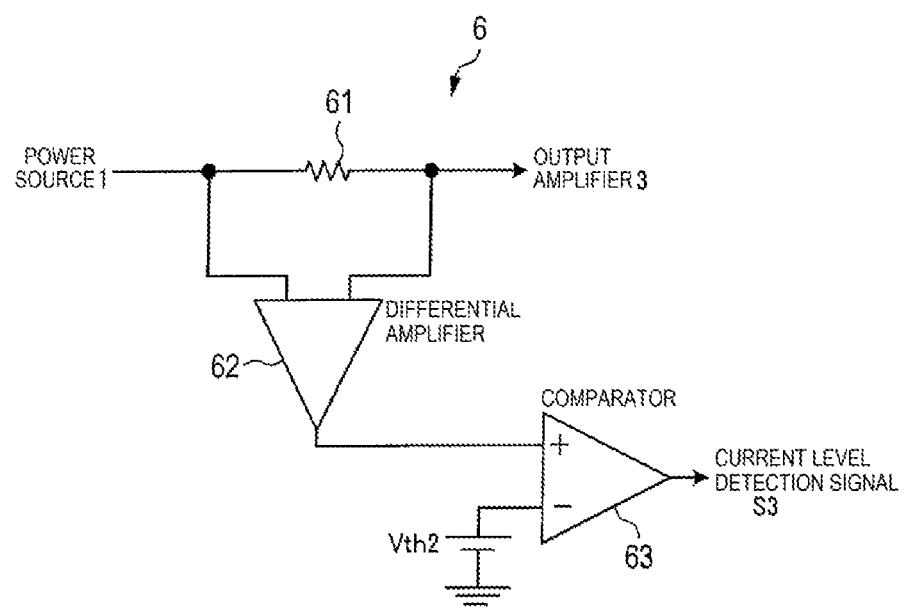
FIG. 4 is a diagram illustrating an example of a configuration of a current level detector according to the first exemplary embodiment.

FIG. 1 is a diagram illustrating an example of a configuration of the protective device according to the exemplary embodiment as a function block. FIG. 2 is a diagram illustrating an example of a circuit configuration of sound level detector 5. FIG. 3 is a diagram illustrating an example of a signal waveform of each part of sound level detector 5 in FIG. 2. FIG. 4 is a diagram illustrating an example of a circuit configuration of current level detector 6.

The audio apparatus according to the exemplary embodiment includes power source 1, sound reproducer 2, output amplifier 3, speaker 4, sound level detector 5, current level detector 6, current breaker 7, and determination section 8. Then, sound level detector 5, current level detector 6, current breaker 7, and determination section 8 composes the protective device. In other words, the protective device according to the exemplary embodiment detects a small volume period by sound level detector 5, detects a current level of the driving current by current level detector 6, and detects the abnormal current on the basis of the driving current in the small volume period.

Power source 1 is, for example, a DC power source such as a battery, and supplies electric power to speaker 4 via output amplifier 3. Note that current level detector 6 and current breaker 7 are provided in a power source circuit that connects power source 1 and output amplifier 3.

Sound reproducer 2 is a device that outputs audio signal S1 corresponding to a sound generated from speaker 4. Sound reproducer 2 comprises, for example, a digital signal processor (DSP), and performs digital-to-analog (DA) conversion of sound data stored as digital data such as pulse code modulation (PCM) data to generate audio signal S1. The audio signal S1 is output to output amplifier 3 and sound level detector 5.

Output amplifier 3 is a power amplifier that outputs the driving current that is power-amplified audio signal S1 to speaker 4. Output amplifier 3 performs operation of power amplification using a current output from power source 1. Thus, a current depending on whether audio signal S1 is large or small flows in the power source circuit between power source 1 and output amplifier 3.

Speaker 4 is, for example, a dynamic speaker that generates a sound corresponding to audio signal S1. The driving current that is power-amplified audio signal S1 output from output amplifier 3 flows in speaker 4 via the driving circuit. Then, sound is output from speaker 4 depending on the driving current flowing in a voice coil equipped in speaker 4.

Sound level detector 5 detects a sound level of audio signal S1, and outputs sound level detection signal S2 to determination section 8. More specifically, sound level detector 5 detects on the basis of audio signal S1 a small volume period in which an amplitude of the audio signal S1 is not more than voltage Vth1 (hereinafter, also simply referred to as "threshold volume Vth1") corresponding to a threshold volume (first threshold), and generates sound level detection signal S2 indicating the small volume period.

Sound level detector 5 comprises, for example, full-wave rectifier circuit 51, envelope detector 52, and comparator 53 (see FIG. 2, FIG. 3). Audio signal S1 is input to full-wave rectifier circuit 51. Signal S1a rectified by full-wave rectifier circuit 51 is output to envelope detector 52. Envelope detector 52 takes out signal S1b of an envelope indicating the amplitude of audio signal S1 by keeping a voltage value of the amplitude of rectified audio signal S1a. Envelope detector 52 inputs the audio signal S1b to a non-inverting terminal of comparator 53. Voltage Vth1 corresponding to the above-mentioned threshold volume is input to an inverting terminal of comparator 53. Then, comparator 53 compares the amplitude of the voltage of audio signal S1 and voltage Vth1 corresponding to the threshold volume, and outputs a comparison result to determination section 8 as sound level detection signal S2. Herein, when the amplitude of the voltage of audio signal S1 is larger than voltage Vth1 corresponding to the threshold volume, a high-level signal is output, and when smaller, a low-level signal is output. Sound level detector 5 detects a small volume period in which the amplitude of the voltage of audio signal S1 becomes not more than threshold volume Vth1 in this manner.

Current level detector 6 detects the current level of the driving current flowing in speaker 4 from power source 1, and outputs current level detection signal S3 to determination section 8. Specifically, current level detection signal S3 is a signal indicating whether the current level of the current flowing in speaker 4 from power source 1 is not less than threshold current Ith (second threshold).

Current level detector 6 comprises, for example, shunt resistor 61, differential amplifier 62, and comparator 63 (see FIG. 4). Shunt resistor 61 is connected in series to the power source circuit between power source 1 and output amplifier 3. Then, the current output to output amplifier 3 from power source 1 flows in shunt resistor 61 and the current level of the current is detected as a voltage value between one end and the other end of shunt resistor 61. Also, differential amplifier 62 amplifies the voltage between the one end and the other end of shunt resistor 61 and inputs it to a non-inverting terminal of comparator 63. Also, threshold voltage Vth2 corresponding to the above-mentioned threshold current Ith (hereinafter, also simply referred to as "threshold current Ith") is input to an inverting terminal of comparator 63. Comparator 63 compares the voltage value indicating the current level input to output amplifier 3 from power source 1 and threshold voltage Vth2 (voltage corresponding to threshold current Ith), and outputs a comparison result to determination section 8 as current level detection signal S3. Then, when the voltage value indicating the current value output to output amplifier 3 from power source 1 is larger than threshold voltage Vth2, comparator 63 outputs a high-level signal, and when smaller, outputs a low-level signal. Note that, threshold voltage Vth2 is generated by, for example, a band gap voltage using power source 1.

Threshold current Ith (second threshold) used when current level detector 6 determines the abnormal current is set, for example, depending on threshold volume Vth1 used when sound level detector 5 determines as a small volume period (descried below with reference to FIG. 5). Specifically, the current flowing in output amplifier 3 from power source 1 becomes a current value depending on whether audio signal S1 is large or small. Accordingly, supposing that a current value of the current that flows when audio signal S1 of threshold volume Vth1 is input to output amplifier 3 is a reference, a current value in which a current having a predetermined magnitude is superimposed on the current value is set as threshold current Ith.

Current level detector 6 more preferably includes a low pass filter for smoothing the current detected (not shown). The current output to output amplifier 3 from power source 1 has a waveform in which an AC component corresponding to the audio signal is superimposed on a DC component. Consequently, when the current level of the current is a value close to threshold current Ith, a hunting can be disadvantageously generated in current level detection signal S3 output from comparator 63. In this regard, for example, providing a low pass filter between differential amplifier 62 and comparator 63 makes it possible to suppress the hunting. Note that, a comparator having a hysteresis property may be used to prevent hunting. Also, an envelope detector may be used like sound level detector 5.

Current breaker 7 is provided in the power source circuit between power source 1 and output amplifier 3, and is a switch circuit that cuts off the current output to output amplifier 3 from power source 1. Current breaker 7 can be composed of, for example, an electromagnetic relay, a transistor, or the like. When protection command signal S4 is input from determination section 8, current breaker 7 turns off a switch of the switch circuit to cut off a route of the current output to output amplifier 3 from power source 1. Note that, current breaker 7 has a self-holding circuit, and once protection command signal S4 is output from determination section 8, the current breaker 7 self holds the protection command signal S4 until power source 1 is turned off to keep the current cutoff state.

Determination section 8 determines generation of the abnormal current in the driving circuit for driving the speaker. Determination section 8 is composed of, for example, an AND circuit, and when both sound level detection signal S2 and current level detection signal S3 are high-level outputs, generates protection command signal S4 (high-level output). That is, determination section 8 determines that the abnormal current is generated when the current level larger than threshold current Ith is detected in a period (small volume period), which including a mute period in which the sound level is zero, in which the sound level of audio signal S1 is smaller than threshold volume Vth1. Then, when it is determined that the abnormal current is generated, determination section 8 generates protection command signal S4 (high-level output) to make current breaker 7 cuts off the current. In contrast, when any of sound level detection signal S2 and current level detection signal S3 is a low-level output, determination section 8 generates no protection command signal S4 (performs low-level output).

<Operation of Protective Device>

Hereinafter, an example of an operation of the protective device according to the exemplary embodiment will be described with reference to FIG. 5.

Figure 5:
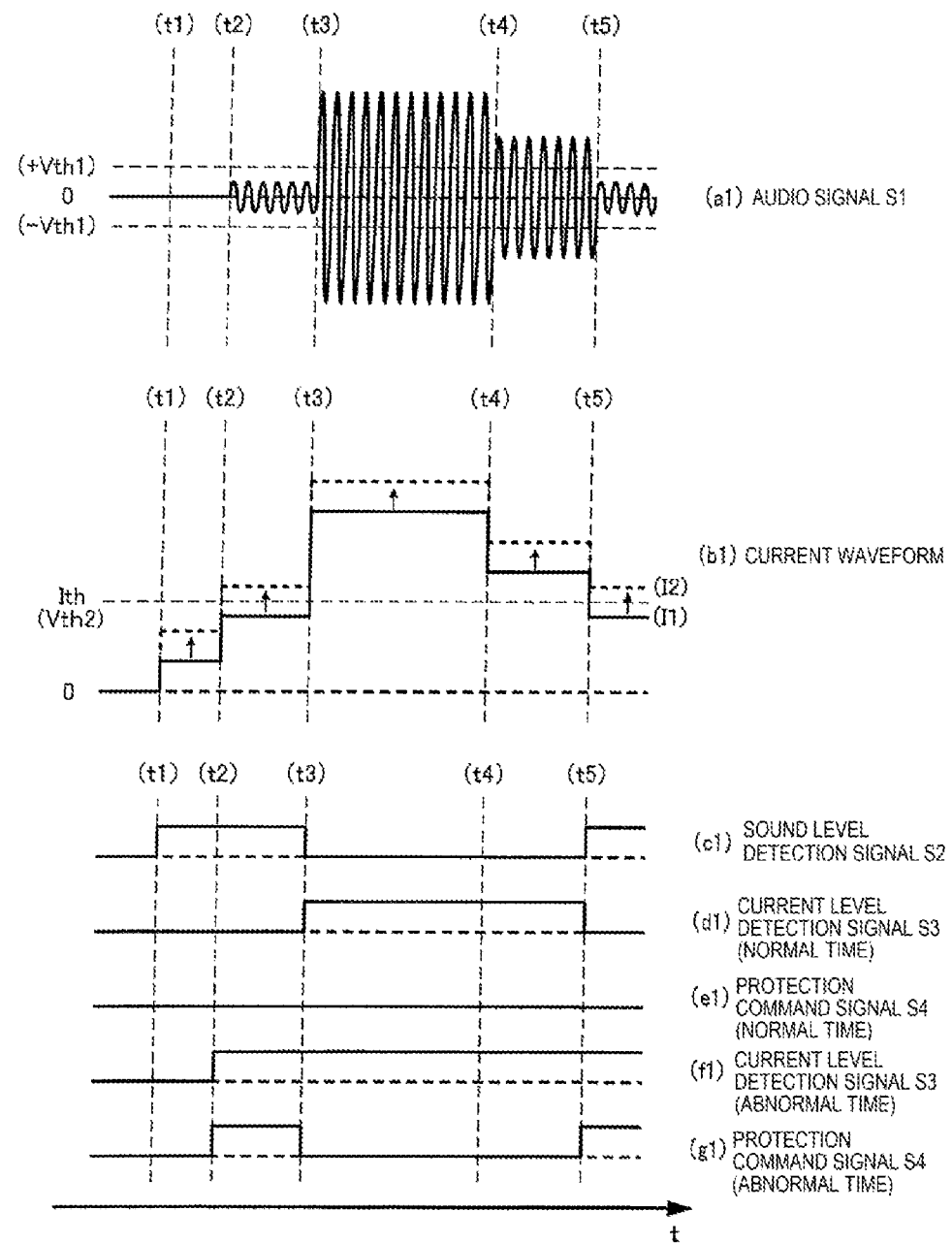
FIG. 5 is a diagram illustrating an example of an operation of the protective device according to the first exemplary embodiment.

FIG. 5 is a diagram illustrating a waveform in each part of the protective device as a timing chart. Note that, for convenience of description, an operation in normal time in which no abnormal current is generated and an operation in abnormal time in which an abnormal current is generated with respect to same audio signal S1 are illustrated in FIG. 5 in a contrast manner. Waveform (a1) is a waveform of audio signal S1 output from sound reproducer 2. Waveform (b1) is a waveform of the driving current flowing in speaker 4 from power source 1 detected by current level detector 6. Waveform I1 illustrates a current waveform in normal time in which no abnormal current is generated. Waveform I2 illustrates a current waveform in abnormal time in which the abnormal current is generated. Waveform (c1) is a waveform of sound level detection signal S2 output from sound level detector 5. Waveforms (d1) and (f1) are waveforms of current level detection signal S3 output from current level detector 6. Waveform (d1) is a signal waveform in normal time, and waveform (f1) is a signal waveform in abnormal time. Waveforms (e1) and (g1) are waveforms of protection command signal S4 output from determination section 8. Waveform (e1) is a signal waveform in normal time, and waveform (g1) is a signal waveform in abnormal time.

Each waveform is illustrated using a common time axis, and timings (t1) to (t5) illustrated by dotted lines indicate timings at which audio signal S1 is changed. Specifically, a period from timings (t1) to (t2) indicates a mute period in which no audio signal S1 is output. A period between timings (t2) to (t3) indicates a period (small volume period) in which the sound level of audio signal S1 is smaller than threshold volume Vth1. A period between timings (t3) to (t4) indicates a period (large volume period) in which the sound level of audio signal S1 is larger than threshold volume Vth1. A period of timings (t4) to (t5) indicates a period (medium volume period) in which the sound level of audio signal S1 is larger than threshold volume Vth1. A period after timing (t5) indicates a period (small volume period) in which the sound level of audio signal S1 is smaller than threshold volume Vth1.

Herein, threshold current Ith used by current level detector 6 as a reference for determination is set, for example, depending on threshold volume Vth1 used by sound level detector 5 as a reference for determination. In other words, a current value in which current having a predetermined magnitude is superimposed on the driving current in normal time in the small volume period is set as threshold current Ith. Then, when the driving current becomes not less than threshold current Ith in the small volume period, both sound level detection signal S2 and current level detection signal S3 become high-level outputs, and protection command signal S4 being a high-level is output.

First, an operation in normal time in which no abnormal current is generated will be described (when the waveform of the driving current has waveform I1).

When power source 1 is turned on at timing (t1), the driving current starts to flow in output amplifier 3 from power source 1. In the period between timings (t1) to (t2), no audio signal S1 is output (mute period) and its sound level is smaller than threshold volume Vth1, so that sound level detection signal S2 is a high-level output (c1) as a period for determining generation of an abnormal current. In contrast, the driving current at this time is smaller than threshold current Ith, so that current level detection signal S3 is a low-level output (d1). This generates no protection command signal S4 as being no abnormal current detection (low-level output) (e1).

In the period between timings (t2) to (t3), the sound level of audio signal S1 is smaller than threshold volume Vth1 (small volume period), so that sound level detection signal S2 is a high-level output (c1) as a period for determining generation of the abnormal current. In contrast, the driving current at this time is smaller than threshold current Ith, so that current level detection signal S3 is a low-level output (d1). This generates no protection command signal S4 as no abnormal current detection (low-level output) (e1).

In the period between timings (t3) to (t4), the sound level of audio signal S1 is larger than threshold volume Vth1 (large volume period), so that sound level detection signal S2 is a low-level output (c1) as a period out for determining generation of the abnormal current. Thus, although the driving current at this time is larger than threshold current Ith and current level detection signal S3 is a high-level output (d1), no protection command signal S4 is generated (low-level output) (e1).

In the period between timings (t4) to (t5), the sound level of audio signal S1 is larger than threshold volume Vth1 (middle volume period), so that sound level detection signal S2 is a low-level output (c1) as a period out for determining generation of the abnormal current. Thus, although the driving current at this time is larger than threshold current Ith and current level detection signal S3 is a high-level output (d1), no protection command signal S4 is generated (low-level output) (e1).

In the period after timing (t5), the sound level of audio signal S1 is smaller than threshold volume Vth1 (small volume period), so that sound level detection signal S2 is a high-level output (c1). In contrast, the driving current at this time is smaller than threshold current Ith, so that current level detection signal S3 is a low-level output (d1). This generates no protection command signal S4 as no abnormal current detection (low-level output) (e1).

Next, an operation in abnormal time in which an abnormal current is generated will be described (when the waveform of the driving current is I2).

Also in this case, sound level detection signal S2 is same as normal time (c1). Then, the period of large volume (timings (t3) to (t5)) is out of a period for determining generation of the abnormal current, so that protection command signal S4 is not generated (low-level output) (e1) like normal time also in abnormal time in the period.

In the period between timings (t1) to (t2), no audio signal S1 is output (mute period), and the sound level is smaller than threshold volume Vth1, so that sound level detection signal S2 is a high-level output (c1) as a period for determining generation of the abnormal current. In contrast, the driving current at this time is smaller than threshold current Ith although the abnormal current is superimposed thereon, so that current level detection signal S3 is a low-level output (f1). This also generates no protection command signal S4 (low-level output) (g1).

In the period between timings (t2) to (t3), the sound level is smaller than threshold volume Vth1, so that sound level detection signal S2 is a high-level output (c1) as a period for determining generation of the abnormal current. Then, the driving current at this time becomes larger than threshold current Ith because the abnormal current is superimposed thereon, so that current level detection signal S3 is a high-level output (f1). This detects generation of the abnormal current, and protection command signal S4 is generated (high-level output) (g1).

In the period after timing (t5), like the period between timings (t2) to (t3), sound level detection signal S2 is a high-level output (c1), and current level detection signal S3 is also a high-level output (f1), so that protection command signal S4 is generated (high-level output) (g1).

In this manner, when an abnormal current is generated, it is detected in a period when the sound level is small. Then, when protection command signal S4 is output to current breaker 7, current breaker 7 cuts off the route of current flowing in output amplifier 3 from power source 1. Note that, when protection command signal S4 is generated (high-level output), protection command signal S4 is self-held, and current breaker 7 continues its current cutoff state until power source 1 is turned off. In FIG. 5, as a convenience for description, a state is illustrated where current level detection signal S3 and protection command signal S4 are continuously output.

As described above, according to the protective device according to the exemplary embodiment, detecting an abnormal current only in a period when the sound level is small makes it possible to detect down to a feeble abnormal current, making it possible to improve detection accuracy of the abnormal current. Then, detection of an abnormal current during sound reproduction becomes possible, which leads to early detection of the abnormal current, making it possible to reliably prevent breakage of the speaker or the power amplifier (power amplifier IC).

(Modification of First Exemplary Embodiment)

In the above exemplary embodiment, as an example, although sound level detector 5 detects whether the sound level of the audio signal S1 is smaller than the first threshold, and current level detector 6 detects whether the current level of the current flowing in the driving circuit from power source 1 is larger than the second threshold, a plurality of the thresholds may be provided to detect multistep levels. For example, threshold current Ith used when an abnormal current is determined may differ between a small volume period and a mute period.

In this case, for example, it is sufficient that comparator 53 of sound level detector 5 and comparator 63 of current level detector 6 are composed by using multi-level comparators and determination section 8 comprises a selection circuit. Then, it is sufficient that determination section 8 determines whether the current level is not less than a second threshold (corresponding to mute period) when the sound level is not more than a first threshold (corresponding to mute period) on the basis of sound level detection signal S2 and current level detection signal S3. Also, it is sufficient that determination section 8 determines whether the current level is not less than a fourth threshold (the fourth threshold is not less than the second threshold and corresponds to the small volume period) when the sound level is not less than the first threshold and not more than a third threshold (corresponding to the small volume period). This makes threshold current Ith depend on the sound level, making it possible to further improve detection accuracy of the abnormal current.

(Second Exemplary Embodiment)

Next, a protective device according to a second exemplary embodiment will be described with reference to FIG. 6 to FIG. 8. The protective device according to the exemplary embodiment differs from that of the first exemplary embodiment in that sound level detection signal S2 output from sound level detector 5 is delayed by a predetermined period in order to synchronize sound level detection signal S2 and current level detection signal S3. Note that the description about other parts common to those of the first exemplary embodiment will be omitted (hereinafter, the same applies to other exemplary embodiments).

Figure 6:
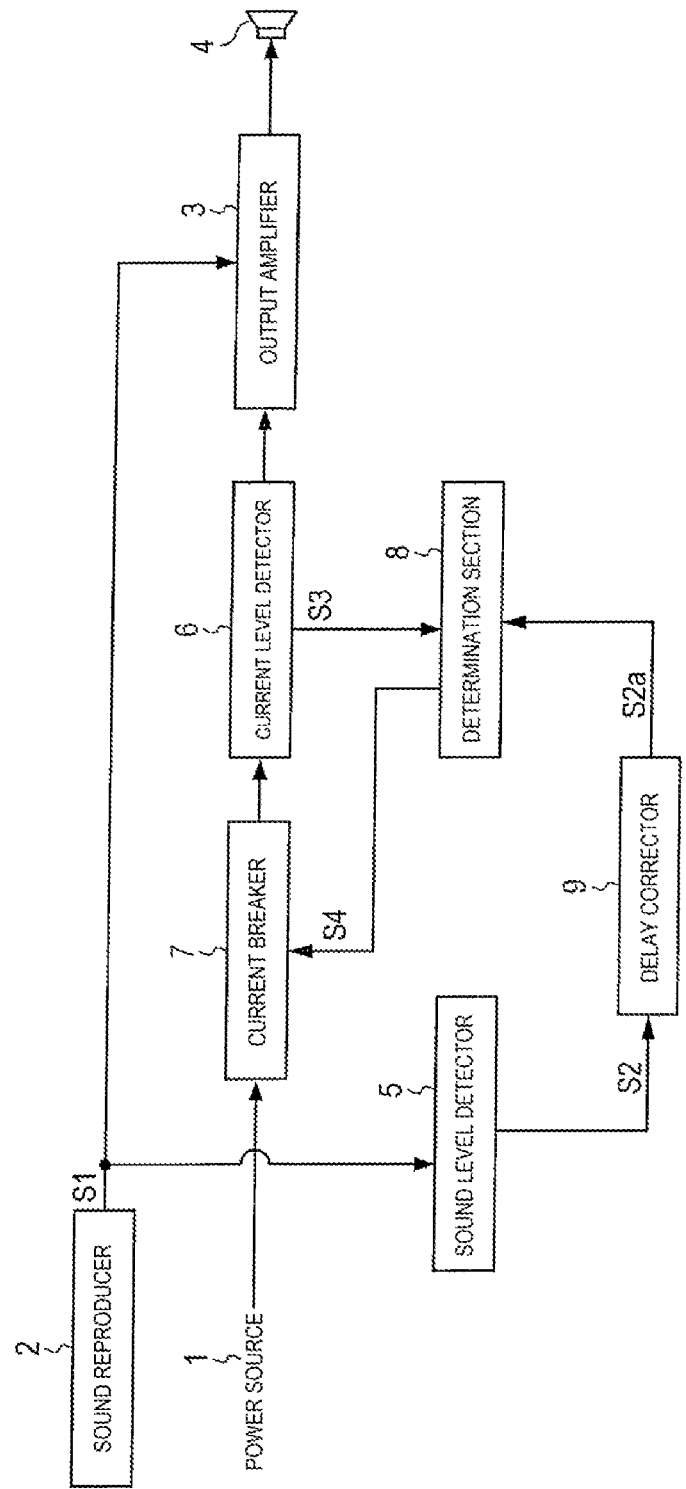
FIG. 6 is a diagram illustrating an example of a configuration of a protective device according to a second exemplary embodiment.

FIG. 6 is a diagram illustrating the protective device according to the exemplary embodiment. The protective device according to the exemplary embodiment includes delay corrector 9. Sound level detection signal S2 output from sound level detector 5 is subjected to delay correction by delay corrector 9, and output to determination section 8.

The driving current corresponding to audio signal S1 may be delayed with respect to audio signal S1 due to an internal configuration or the like of output amplifier 3 of the audio apparatus. In this case, a time lag is generated between sound level detection signal S2 and current level detection signal S3, and determination section 8 can falsely detect an abnormal current, unfortunately. The protective device according to the exemplary embodiment makes sound level detection signal S2 and current level detection signal S3 be synchronized by subjecting sound level detection signal S2 to delay correction by a time (first period) depending on the delay time. More specifically, delay corrector 9 is composed of, for example, a delay circuit, and delays sound level detection signal S2 by the delay time (first period) from a timing when audio signal S1 is detected by sound level detector 5 and output as sound level detection signal S2 to a timing when the current corresponding to audio signal S1 is detected by current level detector 6 and output as current level detection signal S3, and outputs sound level detection signal S2 to determination section 8. Note that, although the delay time (first period) generally can be uniquely determined by the configuration of output amplifier 3, sound level detector 5, and current level detector 6 of the audio apparatus, a delay time detector may be provided to output a test signal of audio signal S1 and determine the delay time on the basis of the detected result.

Determination section 8 determines generation of an abnormal current on the basis of sound level detection signal S2a subjected to delay correction and current level detection signal S3. Then, when both sound level detection signal S2a subjected to delay correction and current level detection signal S3 are high-level outputs, protection command signal S4 is generated.

Figure 7:
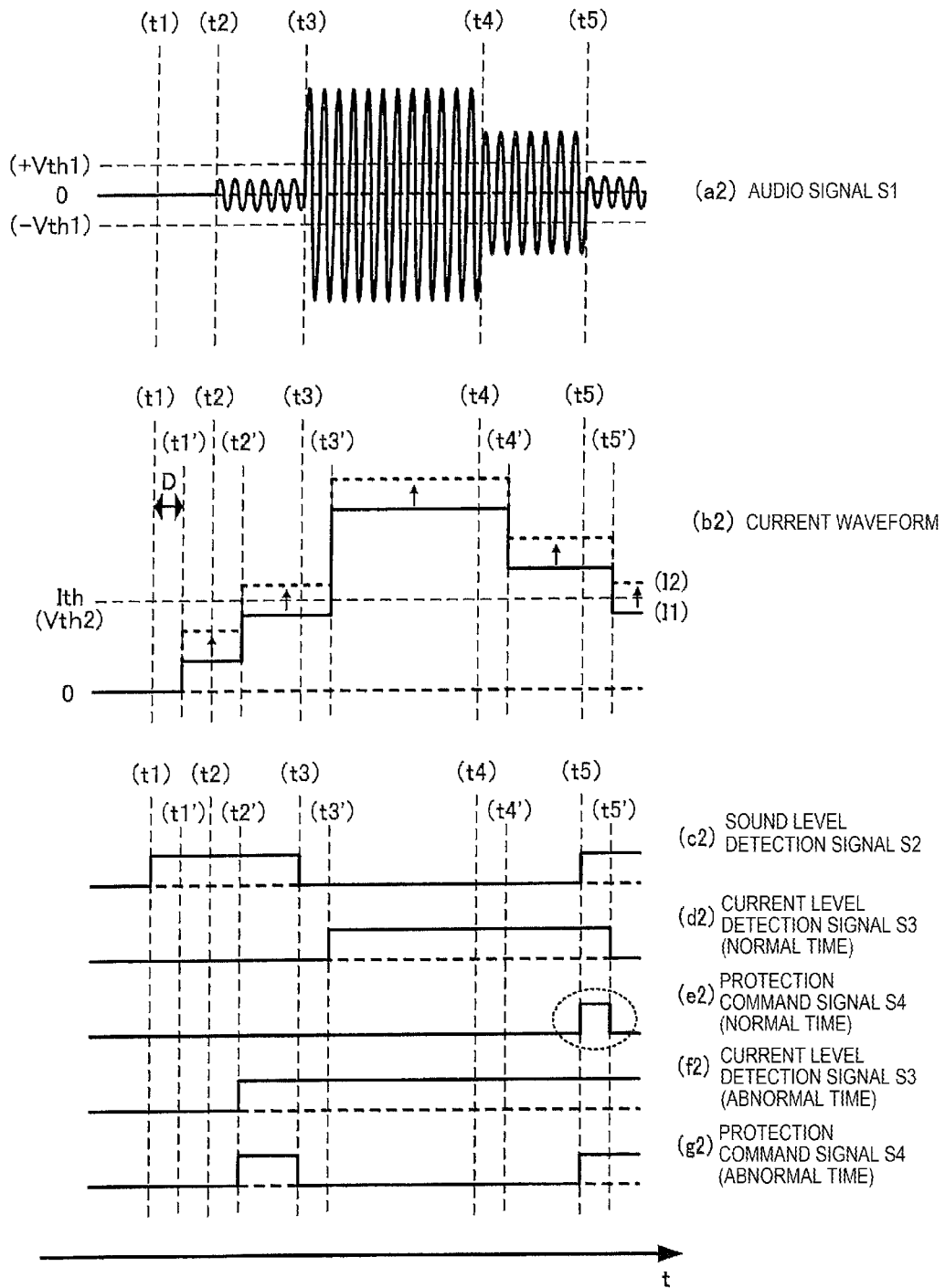
FIG. 7 is a diagram for illustrating an operation of the protective device according to the second exemplary embodiment.

FIG. 7 is a diagram corresponding to above-mentioned FIG. 5, and illustrates a signal waveform of each part when a delay occurs in current level detection signal S3. FIG. 8 is a waveform in above-described FIG. 7, and is a diagram illustrating a signal waveform of each part when sound level detection signal S2 is subjected to delay correction. Herein, for convenience of description, the waveforms of audio signal S1 of FIG. 7, FIG. 8 shall be identical to the waveform of audio signal S1 in FIG. 5. In contrast, the current waveforms in FIG. 7, FIG. 8 are delayed by time D with respect to audio signal S1. Timings (t1') to (t5') illustrated by dotted lines in FIG. 7, FIG. 8 respectively indicate timings delayed by time D with respective to timings (t1) to (t5) illustrated by dotted lines.

In FIG. 7, waveform (d2) of current level detection signal S3 is delayed by time D with respective to waveform (d2) of sound level detection signal S2. Consequently, regardless of normal time when no abnormal current is generated, in the period between timings (t5) to (t5') that is a small volume period following a large volume period, current level detection signal S3 continues a high-level output state (d2) due to the driving current in the large volume period. This makes determination section 8 falsely detect an abnormal current regardless of normal time to generate protection command signal S4 (e2), disadvantageously causing current breaker 7 to operate.

Figure 8:
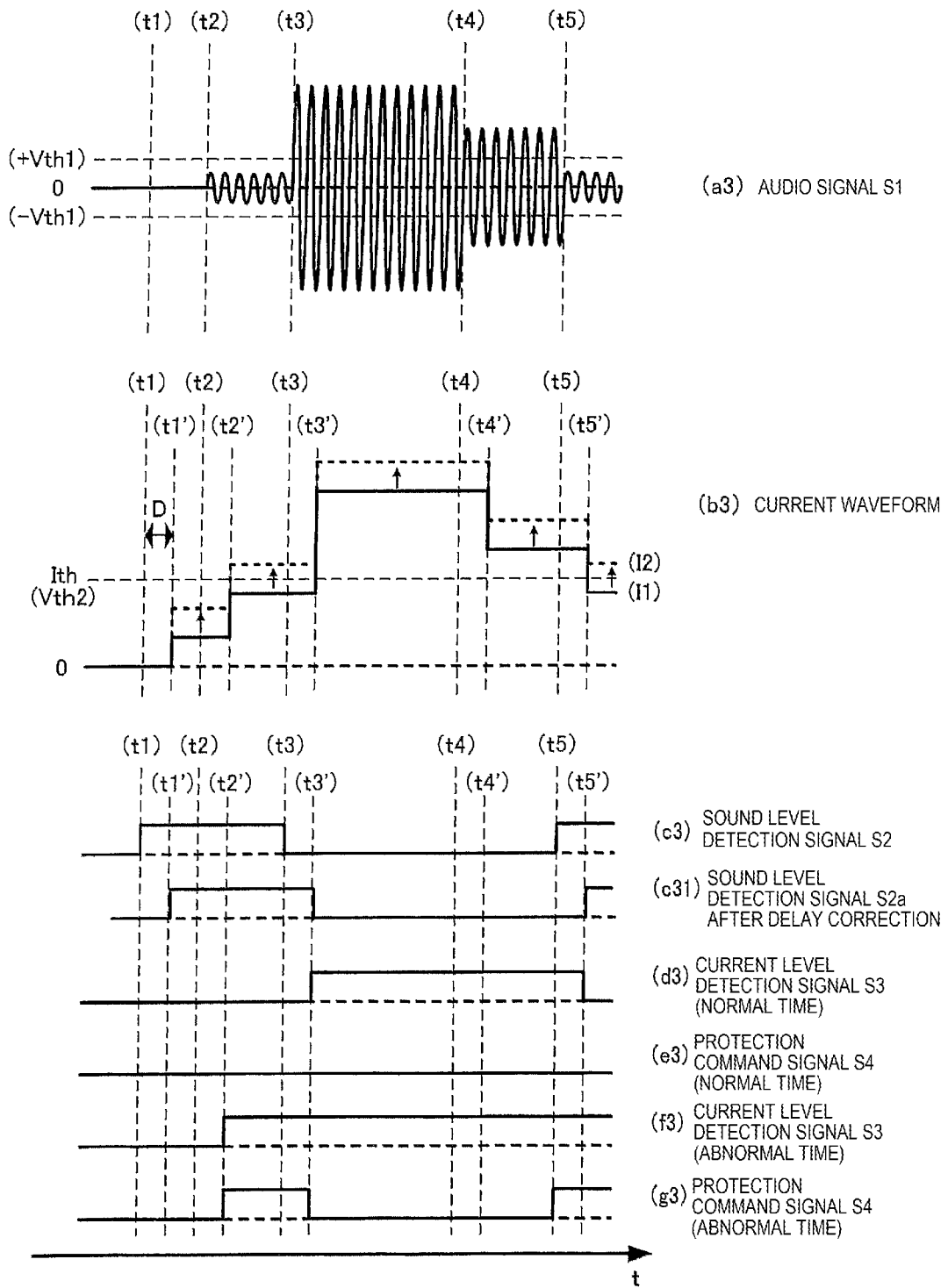
FIG. 8 is a diagram illustrating an example of the operation of the protective device according to the second exemplary embodiment.

In this regard, in FIG. 8, determination section 8 identifies a small volume period using sound level detection signal S2a subjected to delay correction to be delayed as a reference, and determines whether an abnormal current is generated. In other words, determination section 8 determines, as a result, whether the abnormal current is generated in a state where current level detection signal S3 and sound level detection signal S2a are synchronized. In FIG. 8, determination section 8 identifies the period between timings (t1') to (t3') and the period after timing (t5') as small volume periods on the basis of sound level detection signal S2a (waveform c31) subjected to delay correction. When the abnormal current is generated, as is described with reference to FIG. 5, current level detection signal S3 becomes a high-level output in the period between timings (t2') to (t3') and the period after timing (t5'). This enables determination section 8 to detect the abnormal current in the periods (g3).

According to the above protective device according to the exemplary embodiment, an abnormal current is prevented from being falsely detected even when a delay occurs in current level detection signal S3 with respect to sound level detection signal S2, making it possible to improve detection accuracy of the abnormal current.

Note that, in the above-described exemplary embodiment, although sound level detection signal S2 is subjected to delay correction as an example of delay corrector 9, current level detection signal S3 may be subjected to delay correction when a delay occurs in sound level detection signal S2 with respect to current level detection signal S3 due to the configuration or the like of sound level detector 5. That is, delay corrector 9 may delay at least one of sound level detection signal S2 or current level detection signal S3 output to determination section 8 by the first period.

(Third Exemplary Embodiment)

Next, a protective device according to a third exemplary embodiment will be described with reference to FIG. 9 to FIG. 10. The protective device according to the exemplary embodiment differs from that of the first exemplary embodiment in that a duration of a state where the sound level of audio signal S1 is smaller than threshold volume Vth1 is detected.

Figure 9:
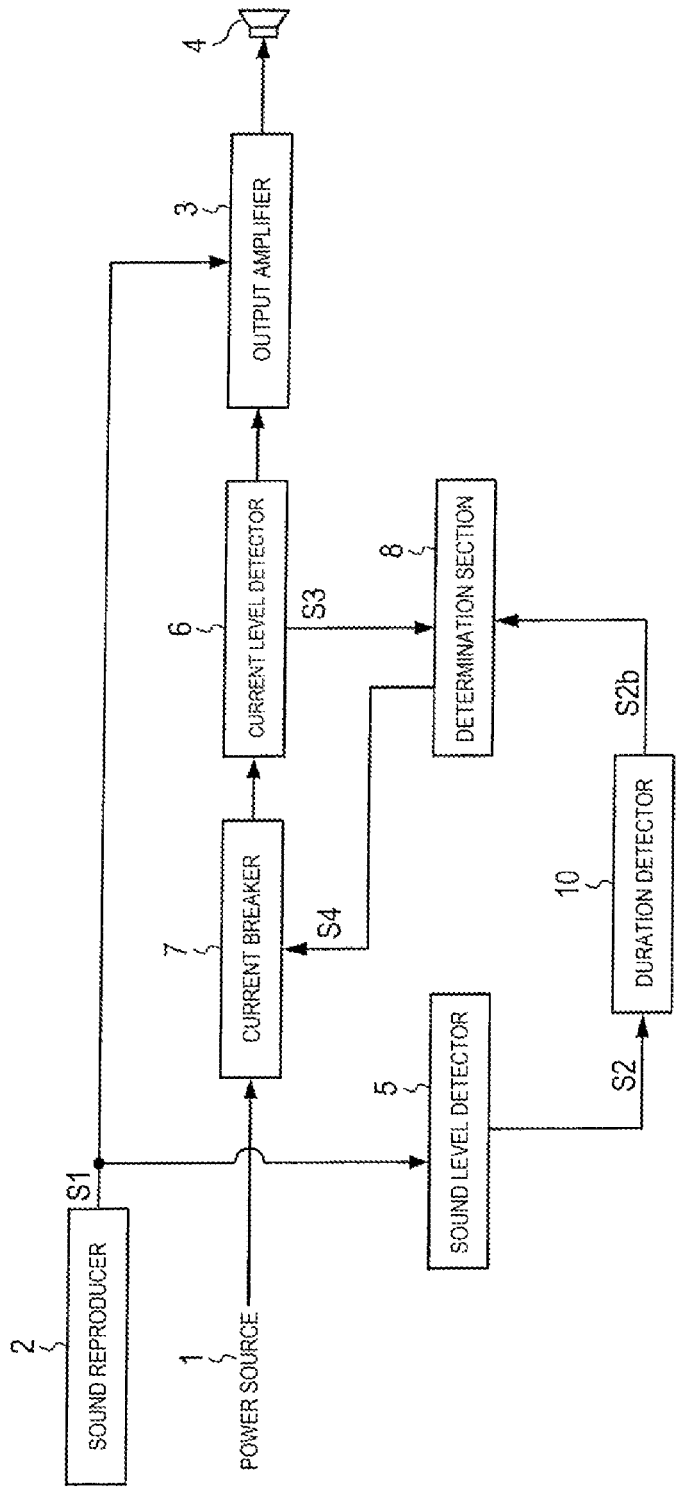
FIG. 9 is a diagram illustrating an example of a configuration of a protective device according to a third exemplary embodiment.

FIG. 9 is a diagram illustrating a configuration of the protective device according to the exemplary embodiment. The protective device according to the exemplary embodiment includes duration detector 10. Sound level detection signal S2 output from sound level detector 5 is input to duration detector 10. Duration detector 10 detects a duration of a state where the sound level of audio signal S1 is smaller than threshold volume Vth1, and enables sound level detection signal S2 (no masking) when the duration exceeds a predetermined period (second period). In other word, duration detector 10 disables sound level detection signal S2 output to determination section 8 (masking) from when a detection signal indicating that the sound level of audio signal S1 becomes a state of being smaller than threshold volume Vth1 to when the duration of the state exceeds the predetermined period (second period). Duration detector 10 is composed of, for example, a counter circuit, and detects the duration by a clock signal acquired from sound reproducer 2 or the like as number of counts. Then, when a predetermined number of counts (second period) is counted, duration detector 10 enables sound level determination section S2 and outputs sound level detection signal S2$b$ to determination section 8. In contrast, when a detection signal indicating a state where the sound level of audio signal S1 becomes smaller than threshold volume Vth1 is changed to a low-level output before the predetermined number of counts (second period) is counted, the count is reset and duration detector 10 waits for starting of duration determination again. That is, determination section 8 continues a state of identifying the state where the sound level of audio signal S1 is larger than threshold volume Vth1.

Determination section 8 determines generation of an abnormal current on the basis of sound level detection signal S2$b$ whose duration is determined to be enabled by duration detector 10 and current level detection signal S3. Then, determination section 8 outputs protection command signal S4 when both sound level detection signal S2$b$ and current level detection signal S3 are high-level outputs. In this manner, limiting the period of determining generation of the abnormal current makes it possible to prevent false detection of the abnormal current due to noise superimposed on audio signal S1.

Herein, when a delay occurs in current level detection signal S3, the period in which sound level detection signal S2 is disabled by duration detector 10 (second period) is preferably set at least not less than the delay time of current level detection signal S3 with respect to sound level detection signal S2 described in the second exemplary embodiment. By doing so, false detection of the abnormal current due to a delay of current level detection signal S3 can be prevented. In contrast, the period (second period) is preferably set to be a time shorter than a mute period so that the abnormal current can be detected also in the mute period provided for a time of switching sound data composing a sequential audio signal. Note that, in the sound reproducer for a CD, a DVD, or the like, a mute period is set between musical works, so that by making the second period shorter than the mute period, the abnormal current can be detected also in the mute period between musical works.

Figure 10:
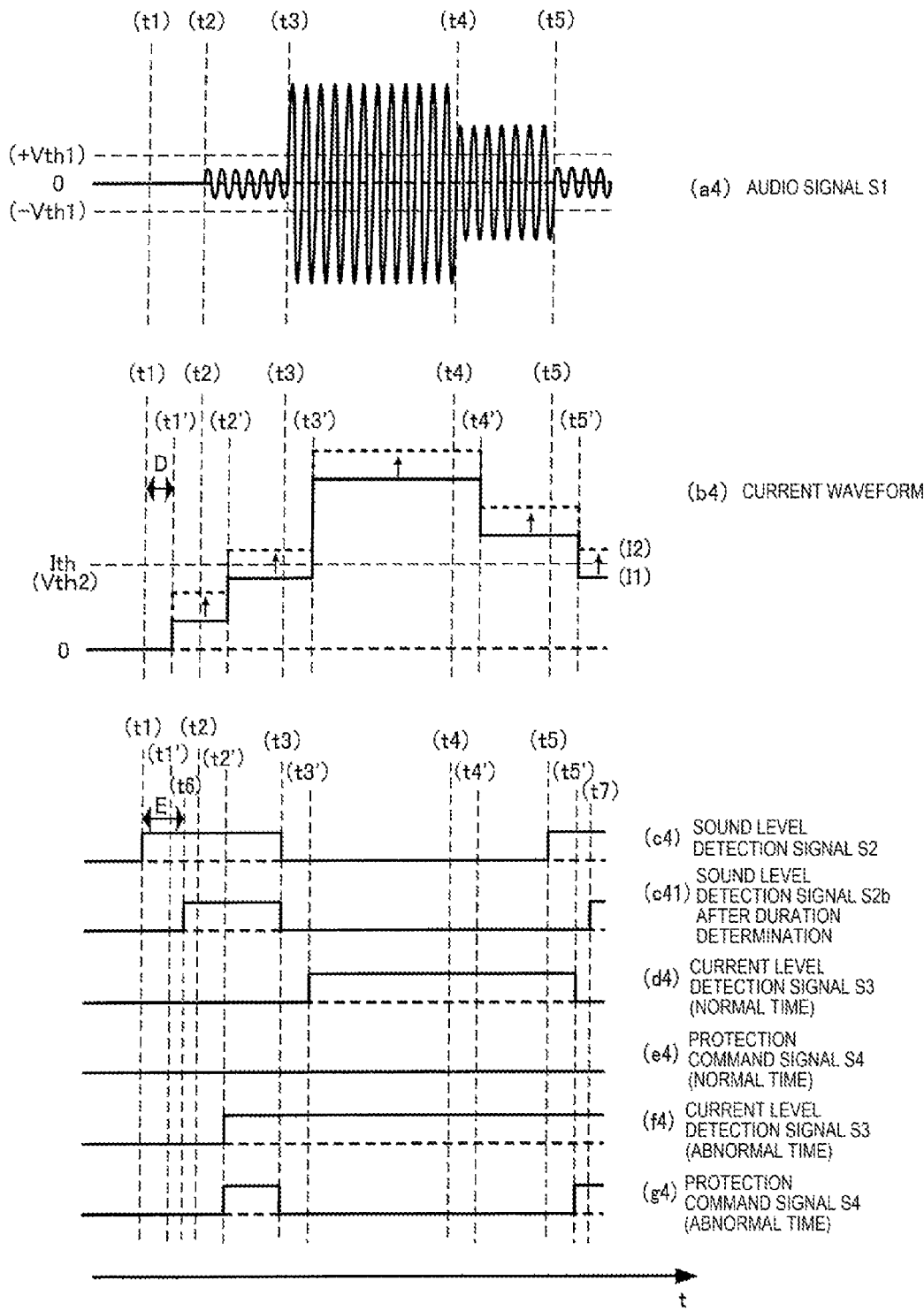
FIG. 10 is a diagram illustrating an example of an operation of the protective device according to the third exemplary embodiment.

FIG. 10 is a diagram illustrating a waveform in each part of the protective device according to the exemplary embodiment as a timing chart. Note that, FIG. 10 illustrates a signal waveform when a delay occurs in current level detection signal S3 like above-mentioned FIG. 7. Timings (t1') to (t5') illustrated by dotted lines in the drawing indicate timings delayed by time D with respective to timings (t1) to (t5) illustrated by dotted lines. Timings (t6) and (t7) illustrated by dotted lines in the drawing indicate timings at which sound level detection signal S2 is determined to be enabled by duration detector 10.

Also in FIG. 10, a delay occurs in current level detection signal S3, so that determination section 8 can falsely detect the abnormal current unfortunately in the period between timings (t5) to (t5') that is a small volume period following a large volume period as described above. In this regard, in the protective device according to the exemplary embodiment, sound level detection signal S2 is disabled (masked) in period E from when a small volume state of sound level detection signal S2 is detected at timing (t1) to timing (t6), and a period from when a small volume state of sound level detection signal S2 is detected at timing (t5) to timing (t7) by duration detector 10. That is, determination section 8 determines generation of the abnormal current in the small volume period between timings (t6) to (t3) and in the small volume period after timing (t7) on the basis of sound level detection signal S2$b$ (waveform c41) enabled by duration detector 10. In this case, since sound level detection signal S2 is also masked between timings (t5) and (t5') that are the small volume period following the large volume period, like the second exemplary embodiment, determination section 8 can be prevented from falsely detecting the driving current in the large volume period as the abnormal current to output protection command signal S4.

As described above, according to the protective device according to the exemplary embodiment, duration detector 10 makes it possible to prevent false detection of an abnormal current due to a noise superimposed on audio signal S1 or a delay of current level detection signal S3.

(Fourth Exemplary Embodiment)

Next, a protective device according to a fourth exemplary embodiment will be described with reference to FIG. 11 to FIG. 12. The protective device according to the exemplary embodiment differs from that of the first exemplary embodiment in that a frequency of a state where the sound level of audio signal S1 is smaller than threshold volume Vth1 in a predetermined period (third period) is detected.

Figure 11:
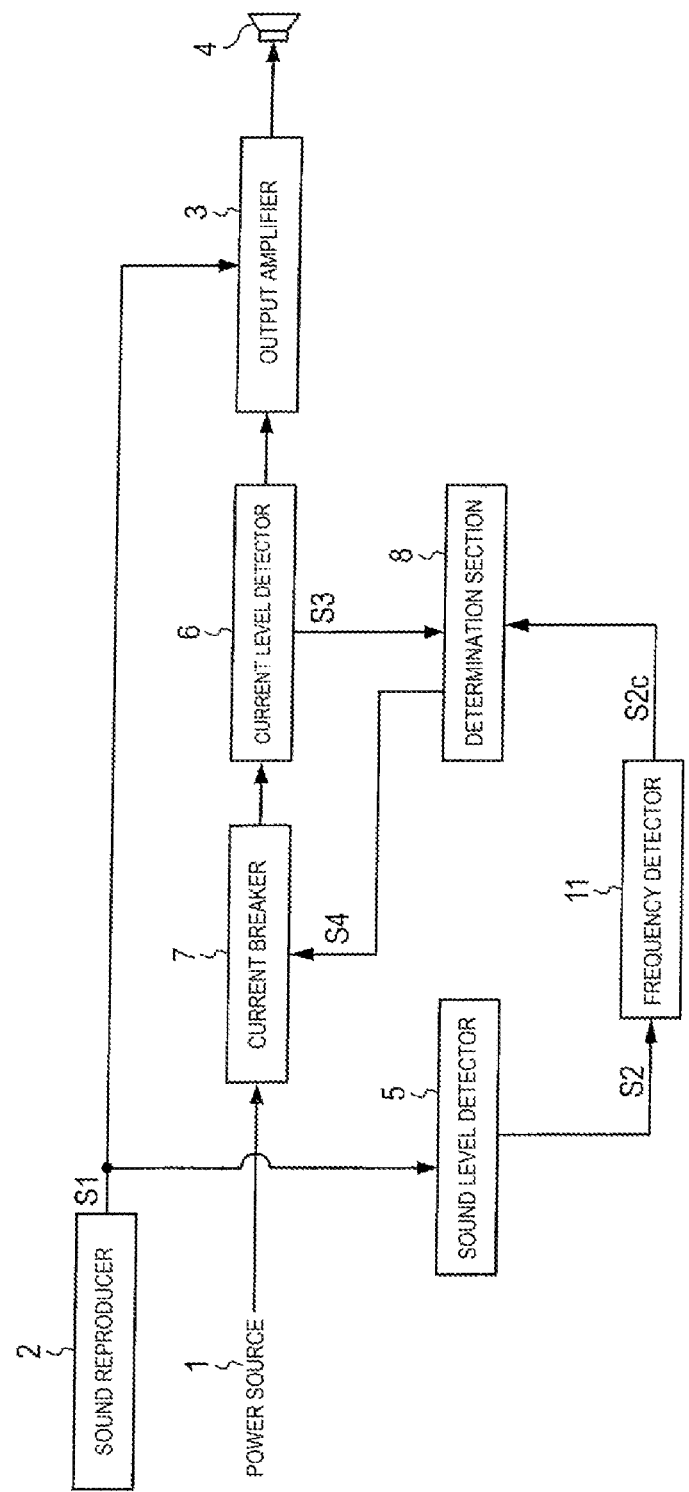
FIG. 11 is a diagram illustrating an example of a configuration of a protective device according to a fourth exemplary embodiment.

FIG. 11 is a diagram illustrating a configuration of the protective device according to the exemplary embodiment. The protective device according to the exemplary embodiment includes frequency detector 11. Sound level detection signal S2 output from sound level detector 5 is input to frequency detector 11. Frequency detector 11 detects a frequency of a state where the sound level of audio signal S1 is smaller than threshold volume Vth1 (time rate) in a predetermined period (third period), and enables sound level detection signal S2 output to determination section 8 when the frequency exceeds the predetermined frequency. In other words, in the predetermined period (third period), frequency detector 11 disables sound level detection signal S2 from when the period is started to when the frequency of a state where the sound level of audio signal S1 is smaller than threshold volume Vth1 exceeds the predetermined frequency (for example, time rate of 50% in the third period). Frequency detector 11 is composed of, for example, a counter circuit, and detects the frequency by counting the number of times of a state where the sound level of audio signal S1 is smaller than threshold volume Vth1 from a timing of starting determination using a clock signal acquired from sound reproducer 2 or the like. Then, when a predetermined number of times is counted, frequency detector 11 outputs sound level detection signal S2$c$ that is enabled sound level detection signal S2 to determination section 8. Then, when the predetermined period (third period) has passed, the count is reset, and frequency detector 11 waits for starting detection of the frequency again. That is, determination section 8 continues a state of identifying the state where the sound level of audio signal S1 is larger than threshold volume Vth1.

Determination section 8 determines generation of an abnormal current on the basis of sound level detection signal S2c enabled by frequency detector 11 and current level detection signal S3. Then, determination section 8 outputs protection command signal S4 when both sound level detection signal S2c and current level detection signal S3 are high-level outputs. Such a configuration makes it possible to prevent false detection of the abnormal current due to a noise superimposed on audio signal S1.

Herein, when a delay of current level detection signal S3 occurs, frequency detector 11 desirably sets the period from when the third period is started to when the detection signal of the sound level is disabled becomes at least not less than the delay time of current level detection signal S3 with respect to sound level detection signal S2. For example, since the time when the sound level is constantly not more than threshold volume Vth1 from a timing when frequency detector 11 starts determination is the shortest time when the detection signal of the sound level is enabled, so that it is preferable that a frequency (time rate) from a timing at which determination is started to when sound level detection signal S2 is enabled be set so as to be longer than the shortest time. By doing so, like third exemplary embodiment, false detection of the abnormal current due to a delay of current level detection signal S3 can be also prevented. Note that, in this case, the timing when frequency detector 11 starts determination may be a time when, for example, a detection signal indicating that the sound level is not more than threshold volume Vth1 is detected. In this regard, instead of the mode, the frequency may be determined for each predetermined interval (for example, one second). Also, in contrast, the period (third period) is preferably set to be shorter than a mute period so that the abnormal current can be detected also in the mute period provided for a time of switching sound data composing a sequential audio signal.

Figure 12:
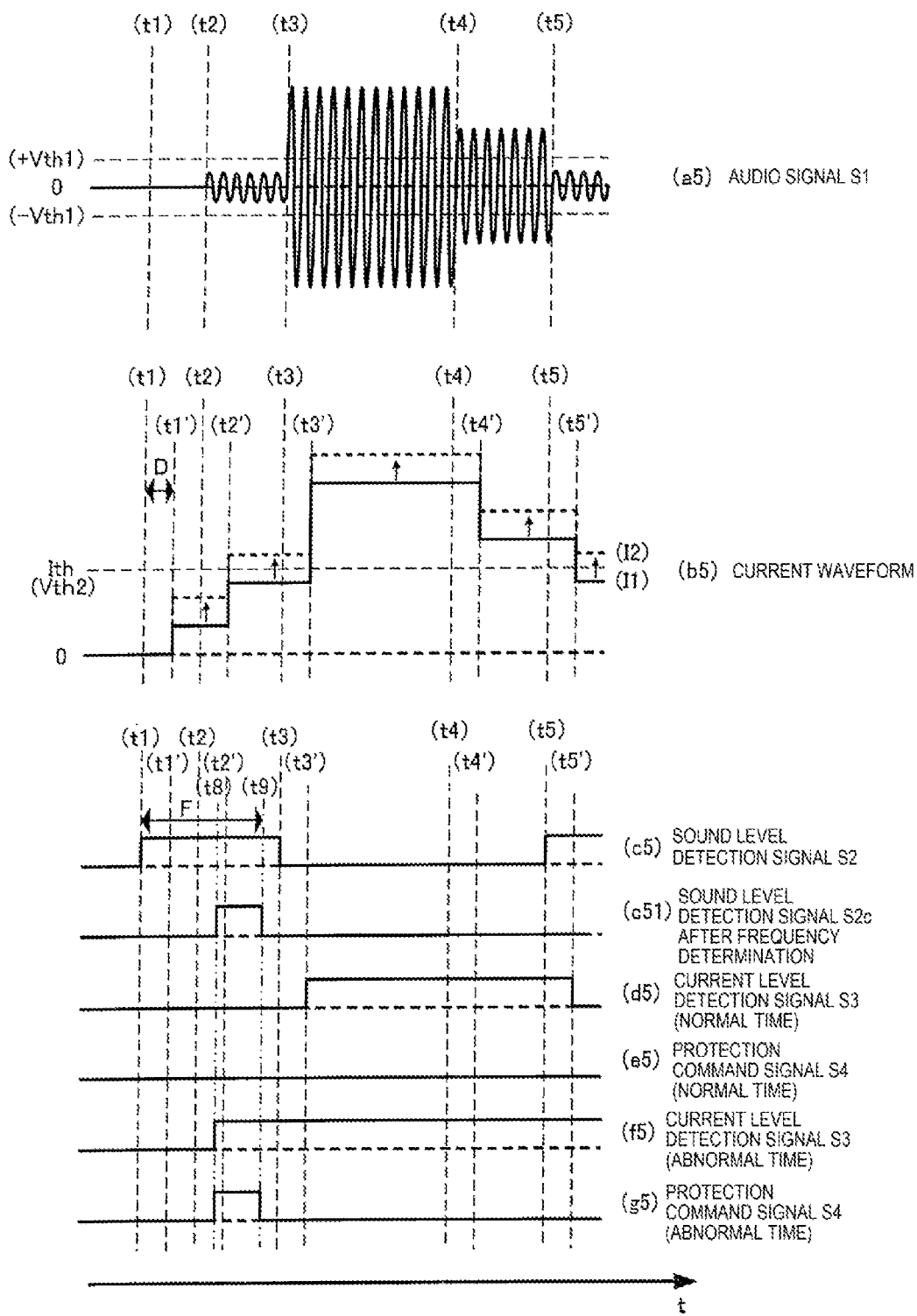
FIG. 12 is a diagram illustrating an example of an operation of the protective device according to the fourth exemplary embodiment.

FIG. 12 is a diagram illustrating a waveform in each part of the protective device according to the exemplary embodiment as a timing chart. Note that, FIG. 12 illustrates a signal waveform when a delay occurs in current level detection signal S3 like above-mentioned FIG. 7. Timings (t1') to (t5') illustrated by dotted lines in the drawing indicate timings delayed by time D with respective to timings (t1) to (t5) illustrated by dotted lines. Also, frequency detector 11 starts determination at timing (t1) illustrated by a dotted line, and detects the frequency in period F (third period) from timing (t1) illustrated by the dotted line to timing (t9) illustrated by a two-dot chain line. Also, FIG. 12 illustrates a state where the frequency reaches a predetermined frequency (for example, time rate of 50% in the third period) at timing (t8) illustrated by a two-dot chain line, and sound level detection signal S2 is enabled.

Also in FIG. 12, a delay occurs in current level detection signal S3, so that determination section 8 can falsely detect the abnormal current unfortunately in a period between timings (t5) to (t5') that is a small volume period following a large volume period as described above with reference to FIG. 7.

In this regard, in the protective device according to the exemplary embodiment, sound level detection signal S2 is disabled (masked) by frequency detector 11 in a period from when the small volume state of sound level detection signal S2 is detected at timing (t1) to timing (t8), and a period from when the small volume state of sound level detection signal S2 is detected to when the frequency reaches the predetermined frequency. That is, determination section 8 determines generation of the abnormal current in the small volume period between timings (t8) to (t9) on the basis of sound level detection signal S2c (waveform c51) enabled by frequency detector 11. In this case, sound level detection signal S2 is also masked in a period between timings (t5) to (t5') that is a small volume period following a large volume period, so that like the second exemplary embodiment, determination section 8 can be prevented from falsely detecting the driving current in the large volume period as the abnormal current to output protection command signal S4.

As described above, the protective device according to the exemplary embodiment makes it possible to prevent false detection of an abnormal current due to a noise superimposed on audio signal S1 or a delay of current level detection signal S3.

(Fifth Exemplary Embodiment)

Next, with reference to FIG. 13, a protective device according to a fifth exemplary embodiment will be described. The protective device according to the exemplary embodiment differs from that of the first exemplary embodiment in that threshold volume Vth1 (first threshold) used when determining a small volume period is set depending on the type of sound source apparatus of the audio signal.

Figure 13:
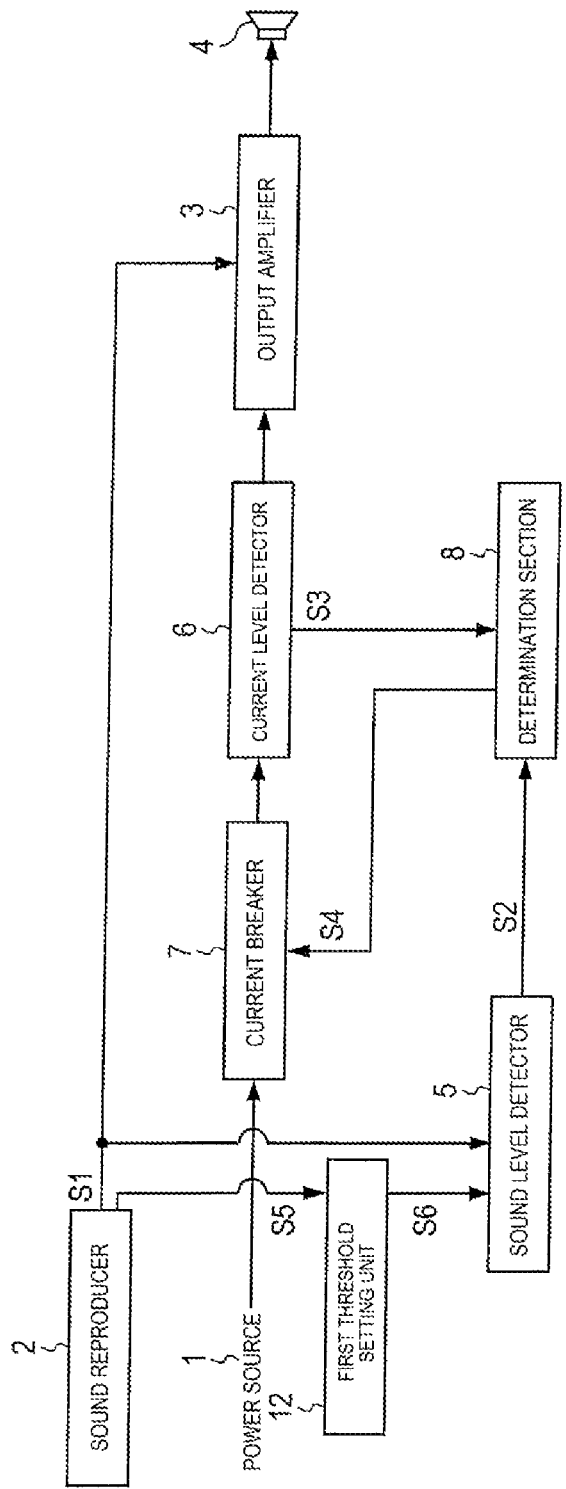
FIG. 13 is a diagram illustrating an example of a configuration of a protective device according to a fifth exemplary embodiment.

FIG. 13 is a diagram illustrating a configuration of the protective device according to the exemplary embodiment. The protective device according to the exemplary embodiment includes first threshold setting unit 12. Threshold volume voltage Vth1 (first threshold) of sound level detector 5 is set by first threshold setting unit 12. For example, first threshold setting unit 12 comprises a resistor.

A noise included in audio signal S1 differs for each type of the sound source apparatus, and for example, in a case where the sound source apparatus is a radio, noise is large, but in a case where the sound source apparatus is for a CD, noise becomes small. Accordingly, when the sound source apparatus is a radio, when threshold volume Vth1 is set to be a small value, the small volume period cannot be detected disadvantageously by a noise superimposed on audio signal S1. Specifically, in a case where a state of identifying as a small volume period when a small volume state continues for a constant period (for example, having duration detector 10), a state continues in which the small volume period cannot be detected. In contrast, when threshold volume Vth1 is set to be a large value, a feeble abnormal current is buried in the driving current, disadvantageously lowering detection accuracy of the abnormal current. Therefore, the exemplary embodiment makes it possible to set threshold volume Vth1 (first threshold) depending on the type of the sound source apparatus of the audio signal, for example, set threshold volume Vth1 to be a large value when the sound source apparatus is a radio as well as set threshold volume Vth1 to be a small value when the sound source apparatus is for a CD.

More specifically, first threshold setting unit 12 acquires data S5 related to the type of sound source apparats of audio signal S1 from sound reproducer 2, and sets the data S5 to the resistor. Then, first threshold setting unit 12 outputs signal S6 to sound level detector 5 so that threshold volume Vth1 corresponding to the set type of sound source apparats is generated. This makes the power source circuit that generates threshold volume Vth1 be controlled, and threshold volume Vth1 corresponding to the set type of sound source apparatus is input to the inverting terminal of comparator 53 of sound level detector 5.

As described above, the protective device according to the exemplary embodiment makes it possible to set threshold volume Vth1 depending on the type of sound source apparatus of audio signal S1, making it possible to continue detection of an abnormal current with an appropriate detection accuracy depending on the type of sound source apparatus. In other word, the protective device enables to prevent false detection of the abnormal current as well as improve detection accuracy of the abnormal current.

Note that, in the above-mentioned exemplary embodiment, although first threshold setting unit 12 comprises a register, a toggle switch operated by the user or the like may be used.

(Sixth Exemplary Embodiment)

Next, a protective device according to a sixth exemplary embodiment will be described with reference to FIG. 14, FIG. 15, FIG. 16. The protective device according to the exemplary embodiment differs from that of the first exemplary embodiment in that threshold current Ith (second threshold) used when determining a current level is set on the basis of a current level of the current measured in a mute period.

Figure 14:
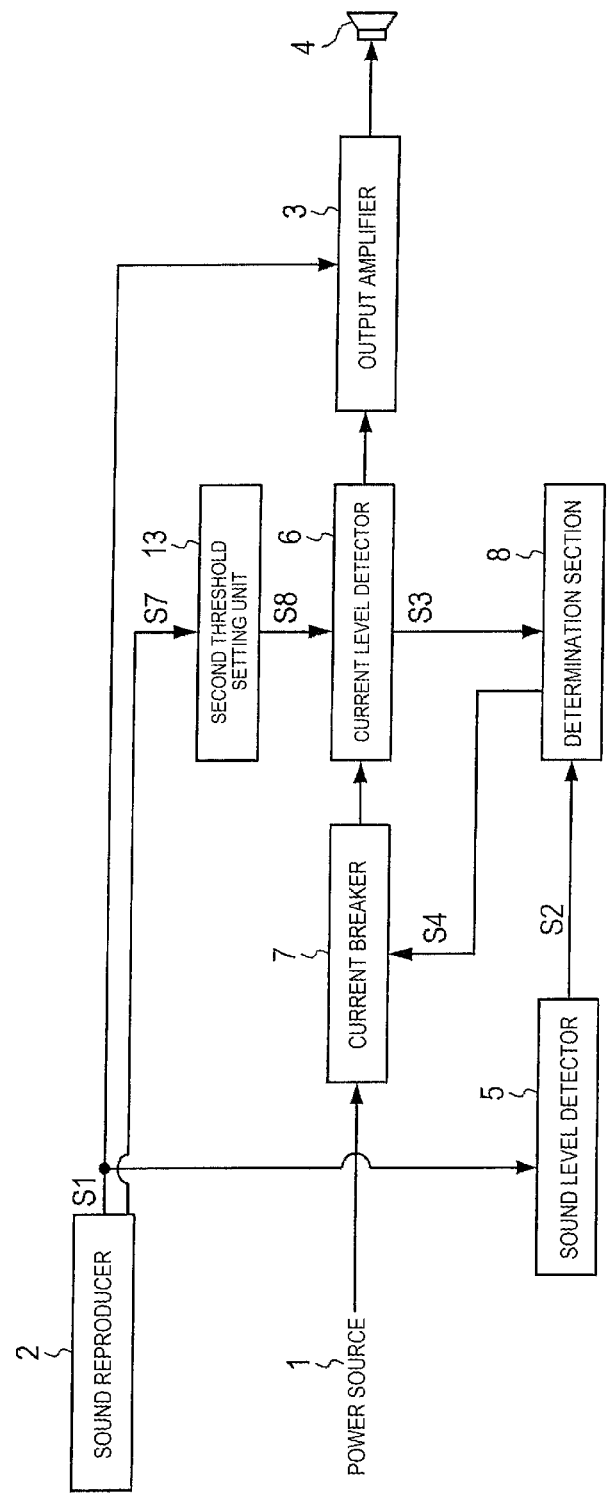
FIG. 14 is a diagram illustrating an example of a configuration of a protective device according to a sixth exemplary embodiment.

FIG. 14 is a diagram illustrating a configuration of the protective device according to the exemplary embodiment. The protective device according to the exemplary embodiment includes second threshold setting unit 13. Threshold voltage Vth2 corresponding to threshold current Ith of current level detector 6 (hereinafter, also simply referred to as "threshold current Ith") is set by second threshold setting unit 13. The current level of the driving current generally differs depending on the type of sound source apparatus or the type of speaker. Then, when threshold current Ith is too large with respect to the current level of the driving current, an abnormal current cannot be appropriately detected, disadvantageously.

Figure 15:
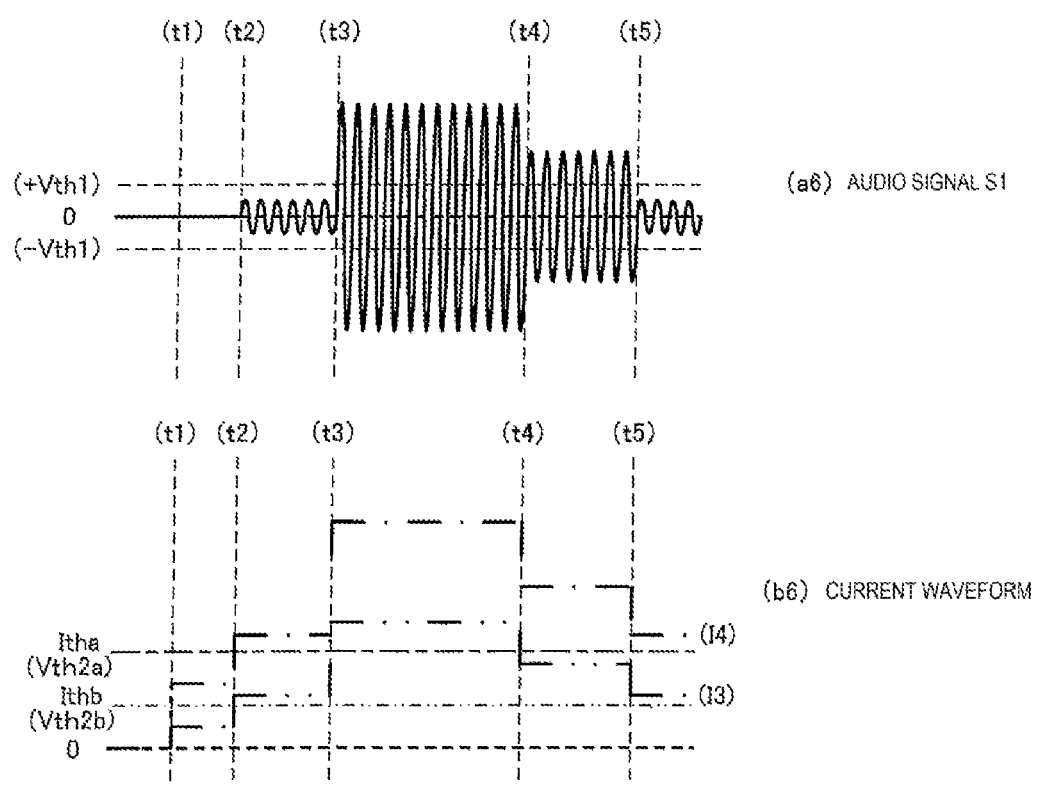
FIG. 15 is a diagram illustrating an operation of the protective device according to the sixth exemplary embodiment.

FIG. 15 is a diagram illustrating an example of the relation between threshold current Ith and the driving current in the case where the current level of the driving current differs. As illustrated in FIG. 15, when the current level of driving current I3 (two-dot chain line) is totally small, when threshold current Itha is a threshold, since threshold current Itha is a large value with respect to the current level of driving current I3 in the small volume period, the abnormal current cannot be detected as long as large abnormal current is not generated. Accordingly, when the current level of driving current I3 (two-dot chain line) is totally small, it is necessary to determine whether the abnormal current is generated using threshold current Ithb smaller than threshold current Itha as a reference. In contrast, when threshold current Ith is too small with respect to the driving current, the abnormal current can be falsely detected disadvantageously by a noise or like included in audio signal S1. Therefore, second threshold setting unit 13 makes it possible to measure the current level of the current flowing in output amplifier 3 from power source 1 (hereinafter, referred to as "steady current") in, for example, a mute period to set threshold voltage Vth2 on the basis of the current level. Note that, FIG. 15 illustrates, as an example, a mode in which threshold current Itha is set with respect to driving current I3 as a threshold, and threshold current Ithb is set with respect to driving current I4 as a threshold.

Figure 16:
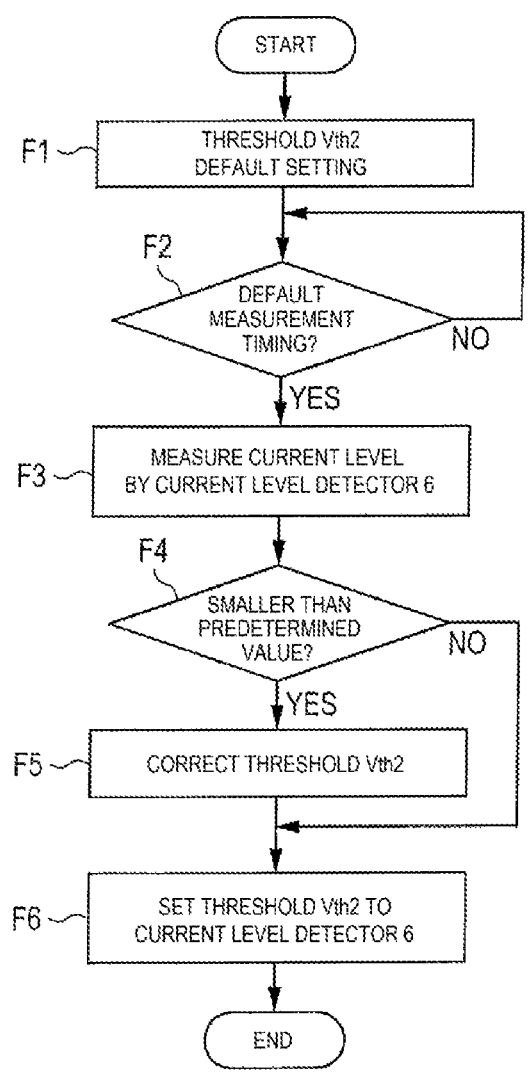
FIG. 16 is a diagram illustrating an example of an operation flow of the protective device according to the sixth exemplary embodiment.

FIG. 16 is a diagram illustrating an example of an operation flow of second threshold setting unit 13. Note that, herein, second threshold setting unit 13 shall be provided by program control executed by a CPU.

First, when power source 1 is turned on, second threshold setting unit 13 sets a default value of threshold current Ith to a storage unit not shown (F1). Note that the default value of threshold current Ith is, for example, average threshold current Ith used when determining the abnormal current as a reference, and is a value in which a predetermined abnormal current is superimposed on the driving current flowing in the small volume period. Then, second threshold setting unit 13 measures the steady current in, for example, a mute period, and corrects the default value of the threshold current Ith when the current level is smaller than a predetermined value. Specifically, second threshold setting unit 13 waits that default measurement timing signal S7 output in the mute period from sound reproducer 2 is output after power source 1 is turned on (F2: NO). Then, when default measurement timing signal S7 is acquired (F2: YES), second threshold setting unit 13 measures the current level of the steady current by using current level detector 6 (F3). Herein, second threshold setting unit 13 shall measure the current level of the driving current by changing a reference voltage input to the inverting terminal of comparator 63 of current level detector 6 in a phased manner. When a signal indicating that the steady current at this time is larger than a predetermined value (for example, magnitude of the steady current in a typical audio apparatus) is acquired (F4: NO), second threshold setting unit 13 determines the initialized threshold current Ith as setting value S8 used when determining the abnormal current (F6). In contrast, when a signal indicating that the steady current at this time is smaller than the predetermined value is acquired (F4: YES), second threshold setting unit 13 corrects the initialized threshold current Ith so as to be a smaller value by a predetermined value (F5), and determines the reduced threshold current Ith as setting value S8 used when determining abnormal current (F6). This makes it possible to set threshold current Ith depending on the current level of the driving current.

As described above, the protective device according to the exemplary embodiment is capable of setting threshold current Ith depending on the current level of the driving current, making it possible to prevent false detection of an abnormal current as well as improve detection accuracy of the abnormal current.

Note that, there are probably various modes as a method of setting threshold current Ith depending on the current level of the driving current in second threshold setting unit 13. For example, in the mute period, audio signal S1 that becomes a test signal may be output from sound reproducer 2 to set threshold current Ith on the basis of a current level detected at the time.

(Seventh Exemplary Embodiment)

Next, with reference to FIG. 17, a protective device according to a seventh exemplary embodiment will be described. The protective device according to the exemplary embodiment differs from that of the first exemplary embodiment in that an abnormal current being generated due to DC offset is detected.

Figure 17:
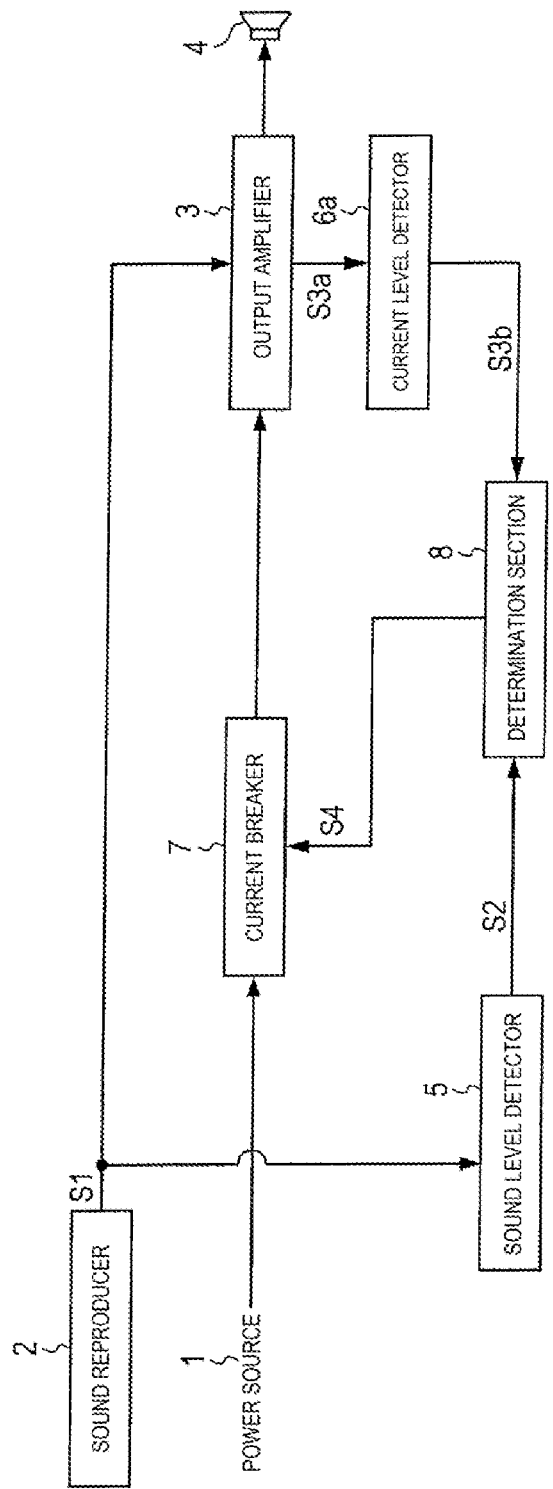
FIG. 17 is a diagram illustrating an example of a configuration of a protective device according to a seventh exemplary embodiment.
Figure 18:
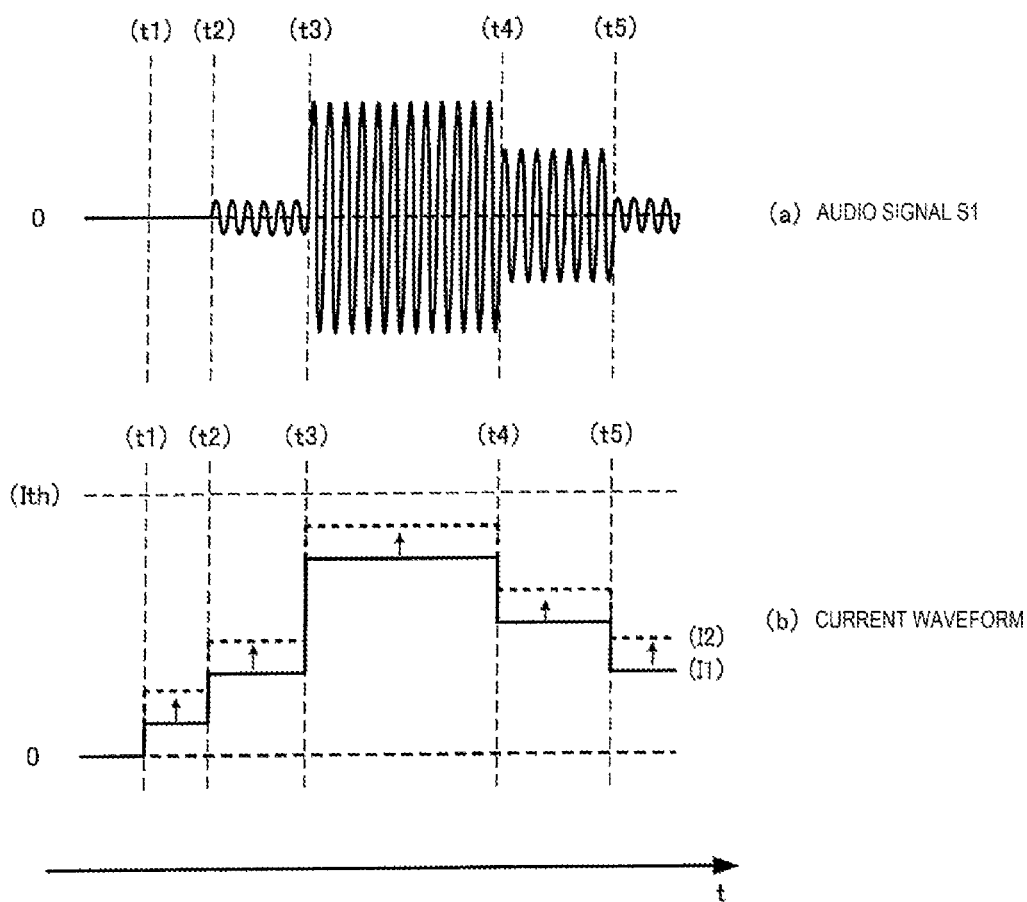
FIG. 18 is a diagram illustrating an operation of an overcurrent detection device of a conventional example.

FIG. 17 is a diagram illustrating a configuration of the protective device according to the exemplary embodiment. Current level detector 6a according to the exemplary embodiment detects a level of a DC offset of output amplifier 3 in order to detect the abnormal current being generated due to the DC offset of output amplifier 3. Current level detector 6a can detect the level of DC offset by detecting differential voltage S3a on output sides of respective an inverting amplifier and a non-inverting amplifier composing output amplifier 3 when, for example, a typical balanced transformer less (BTL) method is used as output amplifier 3. More specifically, the differential voltage on the output sides of respective the inverting amplifier and the non-inverting amplifier composing output amplifier 3 has a waveform in which an AC component corresponding to audio signal S1 is superimposed on a DC offset component, so that only the DC offset component can be extracted from the differential voltage by using a low pass filter or the like. Then, current level detector 6a compares the DC offset component and voltage Vth2 corresponding to a threshold current (second threshold), and output a result of the comparison to determination section 8 as current level detection signal S3b.

Determination section 8 determines whether the abnormal current due to the DC offset is generated on the basis of current level detection signal S3b and sound level detection signal S2, and generates protection command signal S4. Note that, also in the exemplary embodiment, the operations of sound level detector 5 and determination section 8 are same as those described in the first exemplary embodiment.

As described above, the protective device according to the exemplary embodiment makes it possible to promptly detect generation of an abnormal current due to DC offset.

(Other Exemplary Embodiment)

The present invention is not limited to the above-mentioned exemplary embodiments, and various modifications are possible.

Although a mode using a DSP is illustrated as an example of sound reproducer 2 in the above exemplary embodiments, a reproducer of an analog type such as a radio may be used.

Also, in the above-mentioned exemplary embodiments, although sound level detector 5 as an example comprises full-wave rectifier circuit 51, envelope detector 52, and comparator 53, sound level detector 5 may be composed of another circuit component as long as the sound level of audio signal S1 can be detected, and may be composed by using a window comparator and an OR circuit. Also, sound level detector 5 as a part of the DSP may calculate digital data of audio signal S1 to detect a small volume period. Also, an absolute value detection may be performed by calculating digital data of audio signal S1. Also, a square value detection or a square average detection may be performed by calculating digital data of audio signal S2.

Also, in the above-mentioned exemplary embodiments, as an example of current level detector 6, a mode is illustrated in which the current flowing in speaker 4 from power source 1 is detected by shunt resistor 61, but it may be composed of another circuit component as long as the current level can be detected, and a hole element or a current mirror circuit may be used. Also, a position where current level detector 6 detects the current flowing in speaker 4 from power source 1 is not limited in the power source circuit between power source 1 and output amplifier 3, and may be an output side of output amplifier 3. Also, current level detector 6 may calculate digital data of current level detection signal S3 to detect the current level as a part of the configuration of the DSP. Also, the arrangement may be modified by, for example, providing current breaker 7 on the subsequent stage side of current level detector 6.

Also, in the above-mentioned exemplary embodiments, although the current flowing in speaker 4 from power source 1 is cut off by turning off the switch circuit of current breaker 7 in the case where determination section 8 generates protection command signal S4 (high-level output), the protection method is optional, and for example, protection command signal S4 may be output to sound reproducer 2 to output audio signal S1 for warning from sound reproducer 2, or to stop music reproduction. Also, the current value of the current flowing in speaker 4 from power source 1 may be reduced.

Also, in the above exemplary embodiment, a mode is illustrated in which each of sound level detector 5, current level detector 6, determination section 8, and the like is provided by hardware. However, a part or all of the component may be provided by a software configuration by program control such as a microcomputer.

Also, in the exemplary embodiments, as an example of duration detector 10, a mode is illustrated in which duration detector 10 is provided between sound level detector 5 and determination section 8, and a duration of a state where the sound level of audio signal S1 is smaller than the first threshold is detected to disable the sound level detection signal S2 until the duration exceeds the second period. In contrast, in a case of considering only the viewpoint of suppressing false detection due to a noise, duration detector 10 may be provided between current level detector 6 and determination section 8 instead of the above configuration, and a duration of a state where the current level is larger than the second threshold may be detected to disable current level detection signal S3 until the duration exceeds the second period.

Likewise, frequency detector 11 may be also provided between current level detector 6 and determination section 8 to detect a frequency of a state where the current level is larger than the second threshold, and current level detection signal S3 may be disabled until the frequency exceeds a predetermined frequency.

Although specific examples of the present invention are described above in detail, they are mere exemplifications and do not limit the scope of claims. The technology described in the claims includes various variations and changes of the specific examples exemplified above.

At least the following matter will be apparent from the description of the specification and the attached drawings.

A protective device is disclosed that detects an abnormal current in a driving circuit for driving a speaker. The protective device includes sound level detector 5, current level detector 6, and determination section 8. Sound level detector 5 detects a sound level of audio signal S1 output to the driving circuit. Current level detector 6 detects a current level of a current flowing in the driving circuit from a power source. Determination section 8 generates, based on detection signal S2 of the sound level and detection signal S3 of the current level, protection command signal S4 when the current level larger than second threshold Ith is detected when the sound level of the audio signal is smaller than first threshold Vth1. The protective device makes it possible to detect up to a feeble abnormal current by detecting the abnormal current only in a period in which sound level is small, making it possible to improve detection accuracy of the abnormal current. Then, detection of the abnormal current during sound reproduction becomes possible, which leads to early detection of abnormal current, making it possible to reliably prevent breakage of a speaker or a power amplifier (power amplifier IC).

Also, a protective device is disclosed that further includes delay corrector 9 that delays at least one of sound level detection signal S2 or current level detection signal S3 output to determination section 8 by a first period. According to the protective device, the abnormal current is prevented from being falsely detected even when the current level detection signal is delayed with respect to sound level detection signal S2, making it possible to improve detection accuracy of the abnormal current.

Also, a protective device is disclosed that further includes duration detector 10 that detects a duration of a state where the sound level of the audio signal is smaller than the first threshold, and disables the detection signal of the sound level output to the determination section until the duration exceeds a second period. The protective device makes it possible to prevent false detection of the abnormal current due to a noise superimposed on the audio signal.

Also, a protective device is disclosed that further includes frequency detector 11 that detects a frequency of a state in which the sound level of the audio signal is smaller than the first threshold in a third period, and disables the detection signal of the sound level output to the determination section until the frequency exceeds a predetermined frequency. The protective device makes it possible to prevent false detection of the abnormal current due to a noise superimposed on the audio signal.

Also, a protective device is disclosed in which duration detector 10 sets the second period such that the second period is not less than delay time D of detection signal S3 of the current level with respect to detection signal S2 of the sound level. The protective device makes it possible to prevent false detection of the abnormal current due to a noise superimposed on the audio signal and a delay of the current level detection signal.

Also, a protective device is disclosed in which frequency detector 11 sets the period from when a third period is started to when detection signal S2 of the sound level is disabled such that the period is at least not shorter than delay time D of detection signal S3 of the current level with respective to detection signal S2 of the sound level. The protective device makes it possible to prevent false detection of the abnormal current due to a noise superimposed on the audio signal and a delay of the current level detection signal.

Also, a protective device is disclosed in which duration detector 10 sets the second period such that the second period is shorter than a predetermined mute period provided for a time of switching sound data composing a sequence of the audio signal. The protective device makes it possible to prevent false detection of the abnormal current due to a noise superimposed on the audio signal and a delay of the current level detection signal, and to detect the abnormal current also in a mute period.

Also, a protective device is disclosed in which frequency detector 11 sets the third period such that the third period is shorter than a predetermined mute period provided for a time of switching sound data composing a sequence of the audio signal. The protective device makes it possible to prevent false detection of the abnormal current due to a noise superimposed on the audio signal and a delay of the current level detection signal, and to detect the abnormal current also in a mute period.

Also, a protective device is disclosed that further includes first threshold setting unit 12 that sets the first threshold depending on a type of a sound source apparatus of the audio signal. The protective device makes it possible to prevent false detection of the abnormal current and improve detection accuracy of the abnormal current.

Also, a protective device is disclosed that further includes second threshold setting unit 13 that detects the current level of current flowing in the driving circuit from the power source in a predetermined mute period, and sets the second threshold on the basis of the current level. The protective device is capable of setting threshold current Ith depending on the current level of the driving current, making it possible to prevent false detection of the abnormal current and improve detection accuracy of the abnormal current.

INDUSTRIAL APPLICABILITY

The present disclosure is preferable for use in a protective device that detects an abnormal current in a driving circuit for driving a speaker.

REFERENCE MARKS IN THE DRAWINGS

1 power source
2 sound reproducer
3 output amplifier
4 speaker
5 sound level detector
51 full-wave rectifier circuit
52 envelope detector
53 comparator
6, 6a current level detector
61 shunt resistor
62 differential amplifier
63 comparator
7 current breaker
8 determination section
9 delay corrector
10 duration detector
11 frequency detector
12 first threshold setting unit
13 second threshold setting unit

The invention claimed is:

1. A protective device that detects an abnormal current in a driving circuit for driving a speaker, the protective device comprising:
    a sound level detector that detects a sound level of an audio signal output to the driving circuit;
    a current level detector that detects a current level of a current flowing in the driving circuit from a power source;
    a determination section that generates, based on a detection signal of the sound level and a detection signal of the current level, a protection command signal when the current level larger than a second threshold is detected when the sound level of the audio signal is smaller than a first threshold, and
    a duration detector that detects a duration of a state where the sound level of the audio signal is smaller than the first threshold, and disables the detection signal of the sound level output to the determination section until the duration exceeds a second period.

2. The protective device according to claim 1, further comprising a delay corrector that delays at least one of the detection signal of the sound level and the detection signal of the current level output to the determination section by a first period.

3. The protective device according to claim 1, further comprising a frequency detector that detects a frequency of a state where the sound level of the audio signal is smaller than the first threshold in a third period, and disables the detection signal of the sound level output to the determination section until the frequency exceeds a predetermined frequency.

4. The protective device according to claim 1, wherein the duration detector sets the second period such that the second period is not less than a delay time of the detection signal of the current level with respect to the detection signal of the sound level.

5. The protective device according to claim 3, wherein the frequency detector sets a period from when the third period is started to when the detection signal of the sound level is disabled such that the period is at least not shorter than a delay time of the detection signal of the current level with respective to the detection signal of the sound level.

6. The protective device according to claim 1, wherein the duration detector sets the second period such that the second period is shorter than a predetermined mute period provided for a time of switching sound data composing a sequence of the audio signal.

7. The protective device according to claim 3, wherein the frequency detector sets the third period such that the third period is shorter than a predetermined mute period provided for a time of switching sound data composing a sequence of the audio signal.

8. The protective device according to claim 1, further comprising a first threshold setting unit that sets the first threshold depending on a type of a sound source apparatus of the audio signal.

9. The protective device according to claim 1, further comprising a second threshold setting unit that detects the current level of current flowing in the driving circuit from the power source in a predetermined mute period, and sets the second threshold based on the current level.

10. The protective device according to claim 1, wherein the sound level detector is composed of a digital signal processor that calculates digital data.

11. The protective device according to claim 10, wherein the calculation is an absolute value detection, a square value detection, or a square average detection of the audio signal.

12. A protective device that detects an abnormal current in a driving circuit for driving a speaker, the protective device comprising:
a sound level detector that detects a sound level of an audio signal output to the driving circuit;
a current level detector that detects a current level of a current flowing in the driving circuit from a power source;
a determination section that generates, based on a detection signal of the sound level and a detection signal of the current level, a protection command signal when the current level larger than a second threshold is detected when the sound level of the audio signal is smaller than a first threshold; and
a frequency detector that detects a frequency of a state where the sound level of the audio signal is smaller than the first threshold in a third period, and disables the detection signal of the sound level output to the determination section until the frequency exceeds a predetermined frequency.

13. The protective device according to claim 12, further comprising a delay corrector that delays at least one of the detection signal of the sound level and the detection signal of the current level output to the determination section by a first period.

14. The protective device according to claim 12, wherein the frequency detector sets a period from when the third period is started to when the detection signal of the sound level is disabled such that the period is at least not shorter than a delay time of the detection signal of the current level with respective to the detection signal of the sound level.

15. The protective device according to claim 12, wherein the frequency detector sets the third period such that the third period is shorter than a predetermined mute period provided for a time of switching sound data composing a sequence of the audio signal.

16. The protective device according to claim 12, further comprising a first threshold setting unit that sets the first threshold depending on a type of a sound source apparatus of the audio signal.

17. The protective device according to claim 12, further comprising a second threshold setting unit that detects the current level of current flowing in the driving circuit from the power source in a predetermined mute period, and sets the second threshold based on the current level.

18. The protective device according to claim 12, wherein the sound level detector is composed of a digital signal processor that calculates digital data.

19. The protective device according to claim 18, wherein the calculation is an absolute value detection, a square value detection, or a square average detection of the audio signal.

20. A protective device that detects an abnormal current in a driving circuit for driving a speaker, the protective device comprising:
a sound level detector that detects a sound level of an audio signal output to the driving circuit;
a current level detector that detects a current level of a current flowing in the driving circuit from a power source;
a determination section that generates, based on a detection signal of the sound level and a detection signal of the current level, a protection command signal when the current level larger than a second threshold is detected when the sound level of the audio signal is smaller than a first threshold; and
a second threshold setting unit that detects the current level of current flowing in the driving circuit from the power source in a predetermined mute period, and sets the second threshold based on the current level.

* * * * *